United States Patent

Kishimura

[11] Patent Number: 5,591,654
[45] Date of Patent: Jan. 7, 1997

[54] METHOD OF MANUFACTURING A SEMICONDUCTOR DEVICE AND A RESIST COMPOSITION USED THEREIN

[75] Inventor: Shinji Kishimura, Hyogo, Japan

[73] Assignee: Mitsubishi Denki Kabushiki Kaisha, Tokyo, Japan

[21] Appl. No.: 322,131

[22] Filed: Oct. 13, 1994

Related U.S. Application Data

[62] Division of Ser. No. 128,287, Sep. 29, 1993.

[30] Foreign Application Priority Data

Dec. 28, 1992  [JP]  Japan .................................. 4-348601

[51] Int. Cl.⁶ .................................................. H01L 21/266
[52] U.S. Cl. .......................................... 437/26; 437/229
[58] Field of Search .................................... 430/330, 190, 430/311, 191; 437/946, 26, 225, 228, 229, 20

[56] References Cited

U.S. PATENT DOCUMENTS

| | | | |
|---|---|---|---|
| 3,920,483 | 11/1975 | Johnson, Jr. et al. | 437/229 |
| 4,306,011 | 12/1981 | Uehara et al. | 430/190 |
| 4,477,553 | 10/1984 | Yamamoto et al. | 430/190 |
| 4,529,682 | 7/1985 | Toukhy | 430/190 |
| 4,606,931 | 8/1986 | Olsen et al. | 430/917 |
| 4,737,468 | 4/1988 | Martin | 437/26 |
| 4,873,176 | 10/1989 | Fisher | 430/313 |
| 5,114,833 | 5/1992 | Erhardt | 430/313 |
| 5,250,388 | 10/1993 | Schoch, Jr. et al. | 430/311 |
| 5,279,918 | 1/1994 | Nishi et al. | 430/190 |
| 5,290,709 | 3/1994 | Sato et al. | 437/20 |
| 5,328,560 | 7/1994 | Hanawa et al. | 437/229 |
| 5,384,279 | 1/1995 | Stolmeiter et al. | 437/26 |
| 5,393,624 | 2/1995 | Ushijima | 430/311 |
| 5,399,464 | 3/1995 | Lee | 430/331 |
| 5,429,956 | 7/1995 | Shell et al. | 437/26 |
| 5,444,008 | 8/1995 | Han et al. | 437/229 |

FOREIGN PATENT DOCUMENTS

| | | |
|---|---|---|
| 3714577A1 | 11/1987 | Germany . |
| 4106356A1 | 9/1992 | Germany . |
| 2-295114 | 12/1990 | Japan . |

OTHER PUBLICATIONS

*Residual-Surfactant-Free Photoresist Development Process*, J. Electrochem. Soc., vol. 139, No. 6, 1992, pp. 1721–1730.

*Primary Examiner*—Tom Thomas
*Assistant Examiner*—S. Mulpuri
*Attorney, Agent, or Firm*—Lowe, Price, LeBlanc & Becker

[57] ABSTRACT

In a method of forming a buried impurity layer at a deep position of a semiconductor substrate, the resist configuration is prevented from sagging. A resist film having a film thickness of at least 3 μm is formed on a semiconductor substrate. The resist film is exposed selectively to form an image. After exposure and before developing, the resist film is baked at the temperature of 110°–130° C. The resist film is developed and rinsed to form a resist pattern. The generated resist pattern is baked at a temperature of 100° C.–130° C. Using the resist pattern as a mask, impurity ions are implanted at high energy to the main surface of the semiconductor substrate to form a buried impurity layer at a deep position of the semiconductor substrate. Then, the resist pattern is removed.

15 Claims, 17 Drawing Sheets

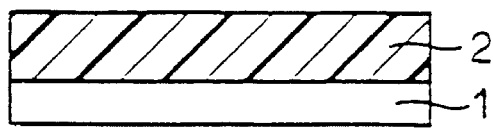
FIG./A
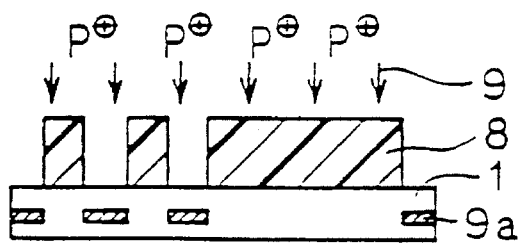
FIG./F
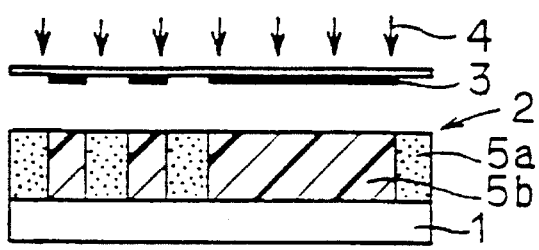
FIG./B
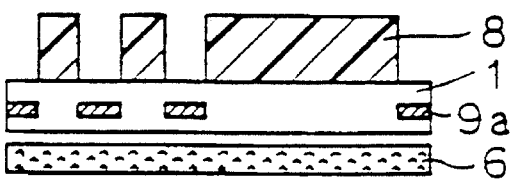
FIG./G
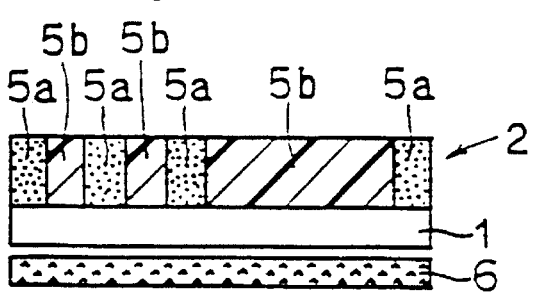
FIG./C
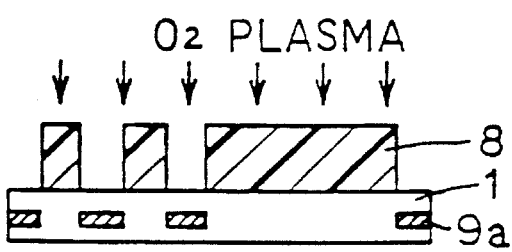
FIG./H
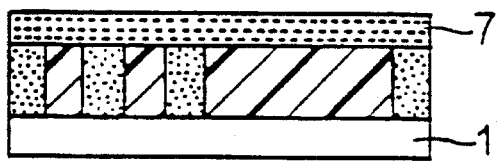
FIG./D
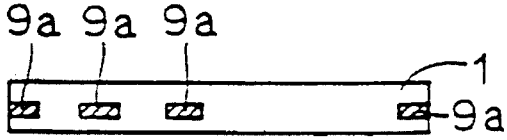
FIG./I
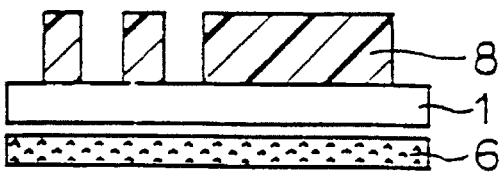
FIG./E

NONDISSOLUTION iLINE=365nm
gLINE=436nm

LIGHT ABSORBANCE

WAVELENGTH(nm)

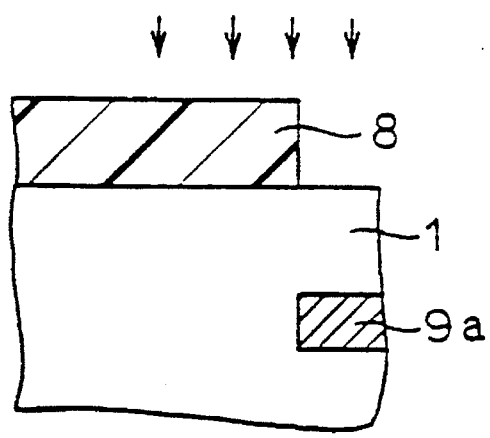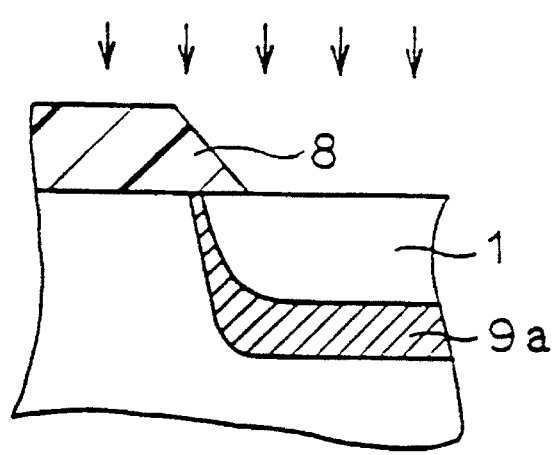

METHOD OF MANUFACTURING A SEMICONDUCTOR DEVICE AND A RESIST COMPOSITION USED THEREIN

This application is a division of application Ser. No. 08/128,287 filed Sep. 29, 1993 now abandoned.

BACKGROUND OF THE INVENTION

1. Field of the Invention

The present invention generally relates to a method of manufacturing a semiconductor device, and more particularly, to a method of forming a buried impurity layer in a deep position of a semiconductor substrate. The present invention also relates to a resist composition used in this method.

2. Description of the Background Art

FIGS. 8A–8E are partial sectional views of a semiconductor device showing sequential steps of forming an impurity layer near the surface (shallow portion) of a semiconductor substrate.

Referring to FIG. 8A, a resist film 2 of 0.5 μm–2 μm, in most cases 1 μm–1.5 μm in thickness is formed on a semiconductor substrate 1.

The reason why the thickness of the resist film may be so thin is set forth in the following. In order to form impurities near the surface (at most 2 μm in depth) of a semiconductor substrate, the implantation energy is not more than 300 keV in boron implantation and not more than 600 keV in phosphorus implantation. Even a thin resist film of less than 2 μm can sufficiently block impurity ions in such a low level of energy.

Referring to FIGS. 8A and 8B, resist film 2 is patterned to a desired configuration to form a resist pattern 8.

If necessary, resist pattern 8 is subjected to far ultraviolet radiation (commonly called Deep UV cure), post baked process, or the like to prevent sagging of the resist configuration caused by a rise in temperature during a subsequent process of ion implantation, or to reduce the amount of gas generation from the resist film (caused by remaining solvent dissolving the resist, or water introduced during developing and rinsing).

Referring to FIGS. 8C and 8D, impurity ions 9 are introduced to the main surface of a semiconductor substrate 1 with resist pattern 8 as a mask to form an impurity ion implantation layer 9a in the main surface of semiconductor substrate 1.

Referring to FIGS. 8D and 8E, resist pattern 8 is removed by ashing using plasma including oxygen. Ashing removal of resist pattern 8 is carried out in an asher.

According to the above-described conventional art, ions are implanted with low energy, whereby an impurity layer is formed near the surface (shallow portion) of a semiconductor substrate.

Recently, the technique is required to form a buried impurity layer in a semiconductor substrate by implanting impurity ions by high energy into the main surface of a semiconductor substrate, as shown in FIG. 9.

FIG. 10A shows the relationship between ion implantation energy and the required minimum film thickness of a resist as a mask in implanting boron ions to the surface of a semiconductor substrate using a resist mask. FIG. 10B shows the relationship between ion implantation energy and the required minimum film thickness of a resist as a mask in implanting phosphorus ions to the surface of a semiconductor substrate using a resist mask.

Referring to FIGS. 10A and 10B, it is appreciated that a resist of at least 3 μm, approximately 3–6 μm in film thickness is required to efficiently serve as a mask when the ion implantation energy exceeds 1 MeV.

However, a resist that can be formed in a film thickness exceeding 3 μm is not substantially known. In general, the concentration of the resist solid in a resist solution must be increased to increase viscosity of the resist solution in order to increase the film thickness. However, there is limitation in increasing the concentration of the resist solid in the resist solution. If attempt is made to increase the concentration to obtain a film thickness of more than 3 μm, the resist solid cannot be dissolved in the resist solvent. Even if a resist solution of required viscosity is temporarily obtained, it is unstable over time with the problem that photosensitive agent is precipitated during storage.

As a resist that solves the above-described problem and that allow formation of a resist film exceeding the thickness of 3 μm, "AZ4620" (a product of Hoechst Limited) is known. Such a resist has the problems set forth in the following.

FIG. 11 is a diagram showing the steps of forming a buried impurity layer in a semiconductor substrate using AZ4620.

Referring to (a) in FIG. 11, AZ4620 is applied on a semiconductor substrate (silicon substrate) 1 to be prebaked on a hot plate at 90° C. for 150 seconds to result in a resist film 2 having a film thickness of 5.0 μm. At least 120 seconds are required for the prebaking time to obtain a uniform film thickness. A prebaking time period of approximately 60 seconds is sufficient for a resist having the normal standard film thickness (0.5 μm–2 μm).

Referring to (b) in FIG. 11, resist film 2 is selectively exposed with a g-line stepper "NSR1505G6E" (a product of Nikon Corporation) using a desired reticle. Then, paddle developing was carried out for 120 seconds using a developer of Tokyo Ohka Kogyo Co., Ltd. "NMD-3" (2.38 wt %) to obtain a resist pattern 8. The sensitivity required to obtain a desired dimension is 1500 msec. This is considerably low in sensitivity in comparison with a resist of standard thickness (normally 150 msec–500 msec). The resolution was 2 μm in line-and-space.

This resist had a problem set forth in the following during the developing process. A slightly soluble layer 8a formed at the sidewall of resist pattern 8 that is not dissolved in the developer is partially peeled off during the developing step. This leads to a problem that the peeled off portion adheres to an exposed portion, i.e. a portion 1a where resist is dissolved, as a resist residue.

It is assumed that slight soluble layer 8a is an azoxy compound shown in FIG. 13 or an azo compound shown in FIG. 14 which is produced by azo coupling reaction between the photosensitive agent and resin. The reason why such a slightly soluble layer 8a is easily generated is set forth in the following. In a resist such as AZ4620 that is improved to increase the film thickness, the amount of photosensitive agent is reduced in order to increase the transparency of the resist. This will reduce the dissolution suppression effect of the resist with respect to a developer caused by the photosensitive agent in non-exposure portions. To compensate for this reduction of dissolution suppression effect, the composition of the resist material is devised such that azo compound or the like that is not easily dissolved in the developer is generated at the surface of the resist. However, this will generate a slight soluble layer at the sidewall of a resist pattern, which in turn yields the above-described problems. For the sake of simplicity, slight soluble layer 8a is not shown in the following drawings.

Referring to (c) in FIG. 11, a deep UV cure process is carried out to improve heat resistance of resist pattern 8. The reason why a deep UV cure process is carried out will be described in details afterwards. By irradiation of deep UV light, i.e. light of a wavelength not more than 300 nm, curing reaction proceeds from the surface to the interior of the resist, whereby sagging of the resist configuration is prevented by the heating during a subsequent post baking step or ion implantation step. However, during this deep UV cure processing step, the generated amount of $N_2$ gas is increased caused by increase of the photosensitive agent amount due to the resist film thickness being increased and by increase of the exposure amount due to reduction in sensitivity. (The photosensitive agent is decomposed while discharging $N_2$ gas as shown in FIG. 12). By generation of this $N_2$ gas, fine particles of the resist are spattered (called cure foaming) to result in contamination.

Referring to (d) in FIG. 11, a baking process (called post baking) in an oven or the like is carried out to draw out gas from the resist film prior to ion implantation. In order to draw out gas efficiently, post baking is carried out in an oven for 60 minutes at 150° C.

Referring to (e) in FIG. 11, impurity ions 9 are implanted at high energy using a thick resist pattern 8. This results in formation of a buried impurity layer 9a at a deep position in semiconductor substrate 1.

The reason why the deep UV cure process shown in (c) in FIG. 11 is required will be described hereinafter.

FIGS. 16A–16C show the result of heat resistance evaluation of the resist pattern at the state shown of (b) in FIG. 11. FIG. 16A shows a sectional view of a resist right after developing. FIG. 16B shows a sectional view of a resist after the resist pattern is heated on a hot plate for 5 minutes at 120° C. FIG. 16C shows a sectional view of a resist after heating at 150° C. for 5 minutes. Comparing FIGS. 16B and 16C, it is appreciated that the rectangular shape of the sectional configuration of the resist pattern is degraded when heated to a temperature exceeding 120° C. The resist is reduced in film thickness in the proximity of the edge of the resist pattern. If the deep UV cure process of (c) in FIG. 11 is not carried out, i.e. if the steps of (d) and (e) in FIG. 11 are carried out directly after the step of (b), heat sagging will occur at the proximity of the edge of the resist pattern due to heating during a post baking step or during impurity ion implantation. This means that ions will not be sufficiently prevented by resist 8 due to reduction in the film thickness. This results in a problem that buried impurity region 9a joins the surface of substrate 1, as shown in FIG. 17B. FIG. 17A shows the shape of buried impurity layer 9a generated in the case where ions are implanted using an ideal rectangular resist pattern. FIG. 17A is provided for comparison with FIG. 17B.

The aforementioned AZ4620 has a problem set forth in the following.

FIG. 18 is a graph showing the relationship between the time period a semiconductor device was left after the application of a resist solution onto the substrate until the exposure step and the sensitivity. It is appreciated from FIG. 18 that at least 30 minutes is required for the semiconductor device to be left after the application and until the exposure for the purpose of stabilization of the sensitivity. This is because the resist must absorb moisture sufficiently from the atmosphere to achieve thorough light reaction of the photosensitive agent during exposure. (Referring to FIG. 12, $H_2O$ is indispensable for photodecomposition of the photosensitive agent.)

A resist film of great thickness requires a long time to absorb moisture from the air in comparison with a resist film having the standard film thickness. If the time left until exposure is carried out is short when using a resist film of great film thickness, moisture will not be absorbed sufficiently, leading to a problem that there is deviation in the sensitivity to adversely affect the throughput.

A similar problem is encountered in using a "OFPR550" (a product of Tokyo Ohka Kogyo Co., Ltd), developed as a resist that provides a great film thickness and that allows usage of i-line. A trend is towards using i-line instead of g-line in accordance with miniaturization of LSIs. A resist generally absorbs more g-line than i-line, as shown in FIG. 15. If a g-line resist is exposed by i-line, various problems will be generated such as reduction in sensitivity, degradation of resolution, and degradation of the sectional shape of the resist. OFPR550 was developed to solve these problems. It is a resist designed to allow usage of i-line and that allows great thickness.

A method of forming a resist pattern using OFPR550 will be described hereinafter.

OFPR550 is applied on a silicon substrate to be prebaked on a hot plate at 90° C. for 90 seconds. This results in a resist film of 4.5 μm in thickness on a silicon substrate. Light is selectively directed using an i-line stepper "NSR1755i7A" (a product of Nikon Corporation), followed by a baking process (post exposure baking:PEB) at 110° C. for 90 seconds on a hot plate. Then, developing is carried out with a developer NMD-3 (2.38 wt %) for 65 seconds to obtain a resist pattern. The sensitivity was 1200 msec., and resolution was 2.0 μm line-and-space. Patterns less than 5 μm was peeled off after the developing process. This means that the adherence is poor. In order to enhance the adherence, the silicon substrate was treated with vapor of hexamethyldisilazane (referred to as HMDS hereinafter) prior to application of the resist. This process improves the adherence such that patterns as low as 2 μm line-and-space were not peeled off. However, there was a problem that fine particles of the resist was spattered (referred to as "exposure foaming"). This resist has low heat resistance, and was not satisfactory as a mask for impurity ion implantation, similar to the above described AZ4620.

A conventional technique is described hereinafter for obtaining a resist pattern having a film thickness greater than 3 μm by stacking more than 2 layers of a resist.

Referring to FIG. 19A, the surface of a silicon substrate 1 is treated with vapor of HMDS. This HMDS process is carried out to enhance the adherence between silicon substrate 1 and a resist which will be described afterwards. A g-line resist "MCPR2000H" (a product of Mitsubishi Kasei Corporation) is applied on the HMDS treated silicon substrate 1 to be subjected to a prebaking process on a hot plate at 100° C. for 70 seconds. As a result, a first resist film 9 is formed having a film thickness of 2.0 μm.

Referring to FIG. 19B, g-line light 10 is selectively directed to first resist film 9 with a g-line stepper "NSR1505G6E" (a product of Nikon Corporation) using a desired reticle 3. As a result, an exposed portion 5a and a non-exposed portion 5b are generated in first resist film 9. Then, PEB is carried at 120° C. for 90 seconds.

Referring to FIG. 19C, paddle developing is carried out for 60 seconds using a developer NMD-3 (2.38 wt %), resulting in a first resist pattern 11 of a desired configuration. Next, a deep UV cure process of first resist pattern 11 is carried out. A deep UV cure process is carried out to improve the heat resistance of first resist pattern 11, whereby heat sagging of the resist pattern is prevented during a subsequent process of post baking. Furthermore, it prevents mixing of a subsequent formed second resist film 12 and first resist pattern 11. Following the deep UV cure process, a post baking process of first resist pattern 11 is carried out in an oven at 150° C. for 60 minutes to prevent gas generation during a subsequent ion implantation process.

Referring to FIG. 19D, a second resist film 12 is formed on silicon substrate 1 so as to cover first resist pattern 11 under conditions identical to those for forming the first resist film (same resist, same prebaking condition).

Referring to FIG. 19E, g-line-light 10 is selectively directed to second resist film 12 using reticle 3 identical to that used for formation of first resist film 11. Then, PEB is carried out for second resist film 12 on a hot plate at 120° C. for 90 seconds. Then, paddle developing is carried out for 70 seconds, resulting in a second resist pattern 13 left on first resist pattern 11. Then, a deep UV cure process is carried out for second resist pattern 13 to improve the heat resistance of second resist pattern 13. Also, a post baking process for second resist pattern 13 was carried out at 150° C. for 60 minutes in order to prevent gas generation during a subsequent ion implantation step. Thus, a two layered resist pattern 14 of a first resist pattern 11 and a second resist pattern 13 is obtained.

Referring to FIG. 19G, phosphorus ions 9 are implanted at high energy using the 2-layered resist pattern 14 as a mask. As a result, a buried impurity layer 9a is formed at a deep position in silicon substrate 1.

Referring to FIGS. 19H and 19I, 2-layered resist pattern 14 is removed by ashing by $O_2$ plasma. This method allows the usage of both the g-line and the i-line. Also, there is no limitation of the type of resist. The problem concerning the adherence between the substrate and the resist, and the problem of gas generation are also solved. Sagging of the resist shape does not occur. Therefore, a resist pattern having a film thickness of greater than 3 µm can be formed without inducing reduction of the resolution. However, this method had a problem that the process is complicated with many processing steps.

SUMMARY OF THE INVENTION

In view of the foregoing, an object of the present invention is to provide a method of forming a buried impurity layer at a deep position in a semiconductor substrate.

Another object of the present invention is to improve resolution in a method of forming a buried impurity layer at a deep position in a semiconductor substrate by implanting ions at high energy to the surface of the semiconductor substrate using a resist pattern having a film thickness of at least 3 µm as a mask.

A further object of the present invention is to prevent sagging of a resist shape during ion implantation in a method of forming a buried impurity layer at a deep position in a semiconductor substrate by implanting impurity ions at high energy to the surface of the semiconductor substrate using a resist pattern having a film thickness of at least 3 µm as a mask.

Still another object of the present invention is to improve adherence between a substrate and a resist in a method of forming a buried impurity layer at a deep position in a semiconductor substrate by implanting impurity ions at high energy to the surface of the semiconductor substrate using a resist pattern having a film thickness of at least 3 µm as a mask.

A still further object of the present invention is to reduce the number of processing steps in a method of forming a buried impurity layer at a deep position of a semiconductor substrate by implanting impurity ions at high energy to the surface of the semiconductor substrate using a resist pattern having a film thickness of at least 3 µm as a mask.

Yet a further object of the present invention is to prevent gas generation from a resist during exposure in a method of forming a buried impurity layer at a deep position of a semiconductor substrate by implanting impurity ions at high energy to the surface of the semiconductor substrate using a resist pattern having a film thickness of at least 3 µm as a mask.

Yet another object of the present invention is to provide a method of preventing the inner sidewall of an ashing device from being contaminated.

Yet a still further object of the present invention is to provide a resist composition that allows realization of the above-described methods.

An additional object of the present invention is to improve storage stability of a resist composition that provides a resist pattern of at least 3 µm in film thickness with one layer of a resist.

To achieve the above objects, a method of manufacturing a semiconductor device according to an aspect of the present invention includes a method of forming a buried impurity layer at a deep position of a semiconductor substrate. A resist film having a film thickness of at least 3 µm is formed on a semiconductor substrate. The resist film is selectively exposed to form an image. After this exposure process and prior to a developing process, the resist film is baked at a temperature of 110° C.–130° C. Then, the resist film is developed and rinsed to form a resist pattern. The generated resist pattern is baked at a temperature of 100° C.–130° C. Using the resist pattern as a mask, impurity ions are implanted at high energy to the main surface of the semiconductor substrate to form a buried impurity layer at a deep position of the semiconductor substrate. The resist pattern is removed.

According to a method of manufacturing a semiconductor device in another aspect of the present invention, the resist film includes a phenol resin having at least 40 mole % of meta cresol unit and a weight-average molecular weight of at least 10000 in polystyrene conversion, and a photosensitive agent having a quinone diazide resin portion. The quinone diazide resin portion is included by 0.40 mmol–0.55 mmol with respect to 1g of the whole resist solid. The photosensitive agent including the quinone diazide resin portion has a structural unit of the following formula.

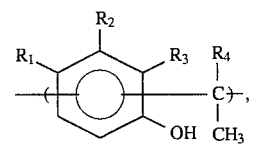

wherein, $R_1$, $R_2$, $R_3$ represent OH, $CH_3$ or H, and $R_4$ represents $CH_3$ or H and in which a hydroxyl group of the resin is partially or completely esterified by 1, 2-naphthoquinone diazide-4-sulfonic acid or 1, 2-naphthoquinone diazide-5-sulfonic acid. Before esterification, the resin which forms the quinone diazide resin portion has a weight-average molecular weight of 500–2000 in polystyrene conversion.

A method of manufacturing a semiconductor device according to a further aspect of the present invention includes a method of forming a buried impurity layer at a deep position in a semiconductor substrate. A resist film of at least 3 μm in thickness is formed on a semiconductor substrate. The resist film is patterned to a desired shape to obtain a resist pattern. Using the resist pattern as a mask, impurity ions are implanted at high energy to the main surface of the semiconductor substrate to form a buried impurity layer at a deep position in the semiconductor substrate. After implantation of impurity ions, the resist pattern is heated at a temperature of at least 120° C. Using a plasma including oxygen, the resist pattern is removed by ashing.

A method of manufacturing a semiconductor device according to still another aspect of the present invention includes a method of forming a buried impurity layer at a deep position in a semiconductor substrate. First, a semiconductor substrate is prepared. The surface of the semiconductor substrate is rinsed to remove adsorbed atoms or a natural oxide film on the surface of the semiconductor substrate. A resist film of at least 3 μm in thickness is formed on the surface of the semiconductor substrate. The resist film is selectively exposed to form an image. The resist film is developed to obtain a resist pattern. Using the resist pattern as a mask, impurity ions are implanted at high energy to the surface of the semiconductor substrate, whereby a buried impurity layer is formed at a deep position in the semiconductor substrate. The resist pattern is removed.

According to a still further aspect of the present invention, the surface of the semiconductor substrate is rinsed using a rinsing agent selected from the group consisting of alkaline mixture such as of $NH_4OH/H_2O_2/H_2O$, and acidic mixture such as of $HCl/H_2O_2/H_2O$, $H_2SO/H_2O_2/H_2O$, $HCl/HNO_3/H_2O$, $HF/H_2O$, $HF/H_2O_2/H_2O$.

A resist composition according to yet a further aspect of the present invention is used to form a buried impurity layer at a deep position in a semiconductor substrate. The composition includes a phenol resin having at least 40 mole % of meta cresol unit and a weight-average molecular weight of at least 10000 in polystyrene conversion, and a photosensitive agent having a quinone diazide portion. The quinone diazide portion is included by 0.40 mmol–0.55 mmol with respect to 1g of the whole resist solid. The photosensitive agent includes a quinone diazide resin portion having a structural unit represented by the general formula

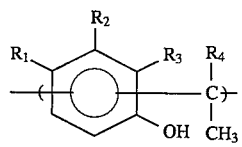

wherein $R_1$, $R_2$, $R_3$ respectively represent OH, $CH_3$ or H, and $R_4$ represents $CH_3$ or H and in which a hydroxyl group of the resin is partially or completely esterified by 1, 2-naphthoquinone diazide-4-sulfonic acid or 1, 2-naphthoquinone diazide-5-sulfonic acid. Before esterification, the resin which forms the quinone diazide resin portion has a weight-average molecular weight of 500–2000 in polystyrene conversion.

In a resist composition according to yet another aspect of the present invention, the phenol resin and the photosensitive agent are dissolved in a solvent selected from the group consisting of cellosolve type solvent, ester type solvent, and high polar liquid.

In the method of manufacturing a semiconductor device according to the said one aspect of the present invention, the resist film is baked at a temperature of 110° C.–130° C. after exposure and before developing, whereby the solvent remaining in the resist film is removed. (If this solvent is not removed, it will act as a flexible material in the resist to degrade the heat resistance of the resist.) This baking process improves the adherence between the resist and the substrate.

Because the resist pattern formed by developing is baked at a temperature of 100° C.–130° C., the moisture permeated in the resist pattern during the developing and rinsing process is removed. (The remaining moisture will become the cause of gas generation at the time of ion implantation.) By this thermal process, gas generation at the time of ion implantation is prevented. Therefore, a post baking process carried out before ion implantation and a deep UV cure process carried out in conventional cases can be omitted.

In the method of manufacturing a semiconductor device according to the said another aspect of the present invention, a phenol resin including at least 40 mole % of meta cresol unit and a weight-average molecular weight of at least 10000 in polystyrene conversion is used as the structural component of the resist film. By using meta cresol, a resin of high molecular weight is obtained to improve heat resistance. Because the hydroxy group in the resin is arranged outwards, the adherence between the substrate and the resin is improved.

Because 0.40 mmol–0.55 mmol of quinone diazide portion with respect to 1g of the whole resist solid is included in the photosensitive agent in the resist film, absorption is reduced, whereby the amount of $N_2$ gas generation during exposure per unit area is reduced.

The photosensitive agent having a quinone diazide portion has a structural unit represented by the general formula

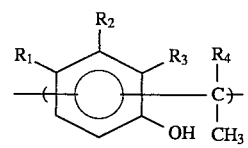

, as defined above and is formed from a resin which before esterification has a weight-average molecular weight of 500–2000 in polystyrene conversion. Therefore, the heat resistance of the resist is improved.

According to the method of manufacturing a semiconductor device of the said further aspect of the present invention, the resist pattern is heated at a temperature of at least 120° C. after implantation of impurity ions. Therefore, degeneration such as carbonization of the resist film occurring during ion implantation or stress due to ion introduction can be alleviated by the heat. Furthermore, because the solvent remaining in the resist film is removed, the degas amount at the time of ashing is reduced to prevent the resist from peeling off.

According to the method of manufacturing a semiconductor device of said still another aspect of the present invention, the surface of the semiconductor substrate is rinsed prior to forming a resist layer on the surface of the semiconductor substrate to remove adsorbed atoms or an natural oxide film on the surface of the semiconductor substrate. This removes the nucleus which become the cause of the generated $N_2$ gas assembly by decomposition of the photosensitive agent at the time of exposure. This prevents damage of the resist film or particles of the resist film to be spattered due to $N_2$ gas concentration.

According to the method of manufacturing a semiconductor device of the said still further aspect of the present invention, the surface of the semiconductor substrate is rinsed using a rinsing agent selected from the group consisting of alkaline mixture such as of $NH_4OH/H_2O_2/H_2O$, and acidic mixture such as of $HCl/H_2O_2/H_2O$, $H_2SO_4/H_2O_2/H_2O$, $HCl/HNO_3/H_2O$, $HF/H_2O$, $HF/H_2O_2/H_2O$. Therefore, adsorbed atoms adhering to the surface or a natural oxide film on the surface of the semiconductor substrate can be removed effectively.

According to the resist composition of the said yet further aspect of the present invention a phenol resin having the above-described formula and a photosensitive agent are included. Thus, a resist film is provided superior in heat resistance and adherence, and reduced in gas generation.

According to the resist composition of the said yet another aspect of the present invention, a solvent selected from the group consisting of a cellosolve type solvent, an ester type solvent, and a high polar liquid is used. Therefore, the dissolution of the phenol resin and the photosensitive agent is promoted to improve stability of the resist composition.

A preferably used solvent includes ethyl cellosolve acetate, ethyl lactate, ethyl pyruvate, methyl-3-methoxy propionate, methyl n-amyl ketone, 4-methoxy-4-methylpentane-2-one, ethyl-3-ethoxy propionate, propylene glycol monomethyl ether acetate, and the most preferable solvent includes methyl-3-methoxyl propionate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A–1I are partial sectional views of a semiconductor device showing sequential steps of a method of manufacturing a semiconductor device according to an embodiment of the present invention.

FIGS. 17A and 17B are diagrams for showing problems when a conventional resist pattern of poor heat resistance is used.

DESCRIPTION OF THE PREFERRED EMBODIMENTS

Figure 2A:
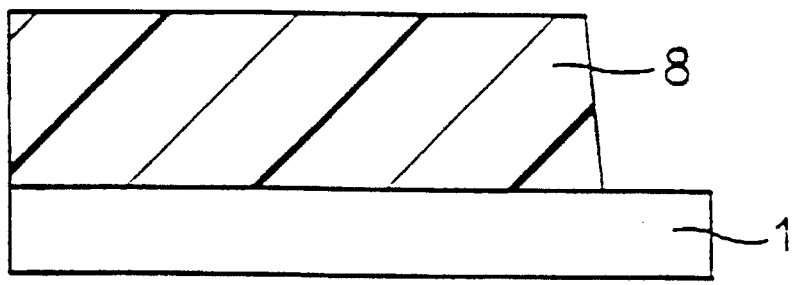
FIGS. 2A–2C show the evaluation result of heat resistance of an obtained resist pattern.

Embodiments of the present invention will be described hereinafter with reference to the drawings.

EMBODIMENT 1

A positive type resist used in the present embodiment will first be described. The used positive type resist includes a phenol resin obtained by condense-copolymerization of m-cresol, p-cresol, and formaldehyde. The composition ratio m/p was 7/3. The m-cresol unit and the p-cresol unit are arranged in random. The weight-average molecular weight was 15000 in polystyrene conversion measured by GPC (Gel Permeation Chromatography).

The photosensitive agent includes a quinone diazide resin portion formed from the following structural unit chemical formula to which photosensitive functional groups are coupled.

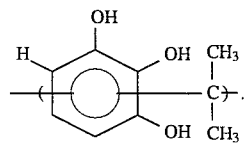

The resin was a condense-polymer of pyrogallol and acetone. The weight-average molecular weight was 1050 (measured by GPC) in polystyrene conversion. 45% of the hydroxyl group was esterified by 1, 2-naphthoquinone diazide-5-sulfonic acid. The 1, 2-naphthoquinone diazide-5-sulfonic portion is included by 0.5 mmol with respect to 1g of the whole resist solid (phenol resin and photosensitive agent). The phenol resin and the photosensitive agent were dissolved in methyl-3-methoxy propionate to be used as the resist solution. The viscosity of the resist solution was prepared so as to result in a desired film thickness when applied on a substrate.

The resist solution generated according to the above method had a viscosity of 200 cP with favorable storage stability. The resist solution provided a resist film having a film thickness of 3 µm–6 µm. When the resist solution was applied on a 6 inch wafer, the film thickness was uniform throughout all portions. The standard deviation of the film thickness (3 σ) was not more than 100 Å. This standard deviation value has a level identical to that of a resist for standard film thickness.

A method of forming a buried impurity layer at a deep position in a semiconductor substrate using the above-described positive type resist will be described hereinafter with reference to FIGS. 1A–1I.

Referring to FIG. 1A, the above-described resist solution is spin-coated on a semiconductor substrate (silicon substrate) 1 to be subjected to a prebaking process for 100 seconds at 80° C. on a hot plate. This results in a resist film 2 having a film thickness of 5.0 µm.

Referring to FIG. 1B, i-line light 4 is selectively directed to resist film 2 with an i-line stepper "NSR1755i7A" (a product of Nikon Corporation) using a desired reticle 3. As a result, an exposed portion 5a and a non-exposed portion 5b are formed in resist film 2.

Referring to FIG. 1C, semiconductor substrate 1 is placed on a hot plate 6, whereby resist film 2 is baked for 90 seconds at 120° C. after exposure and prior to developing. An uneven distribution of the photosensitive agent on exposed portion 5a is made uniform by this baking process after exposure and before developing. This uneven distribution of the photosensitive agent occurs due to interference of incident light and reflected light from the substrate. By this baking process, a resist pattern of high resolution is obtained with the sectional shape of the resist pattern improved. This baking process also removes the solvent remaining in the non-exposed portion 5b remaining after the developing process. Therefore, the adherence between the resist pattern and the substrate is improved.

Referring to FIG. 1D, exposed portion 5a of resist film 2 is dissolved and removed by a paddle developing process for 100 seconds using a developer 7 which is NMD-3, 2.38 wt %.

Then, a rinsing process is carried out with water to obtain a resist pattern 8.

Referring to FIG. 1E, semiconductor substrate 1 is mounted on hot plate 6 after the developing process. The resist pattern is baked for 120 seconds at 110° C. This baking process is carried out to remove water permeated in resist pattern 8 during the developing and rinsing process.

The exposure amount for obtaining a desired mask dimension was 1000 msec using the above-described resist solution. The limiting resolution was 0.90 µm line-and-space even when the film thickness of the resist film was 5.0 µm, indicating high resolution. There was no gas generation even when exposure was carried out for 2000 msec. Sufficient adherence between the resist and the substrate was obtained without having to subject the substrate to an adherence enhancement process by hexamethyldisilazane. There was also no generation of resist residue after the developing process. Furthermore, there was no variation in the sensitivity caused by difference in the time period from the application of a resist up to the exposure step.

Figure 2B:
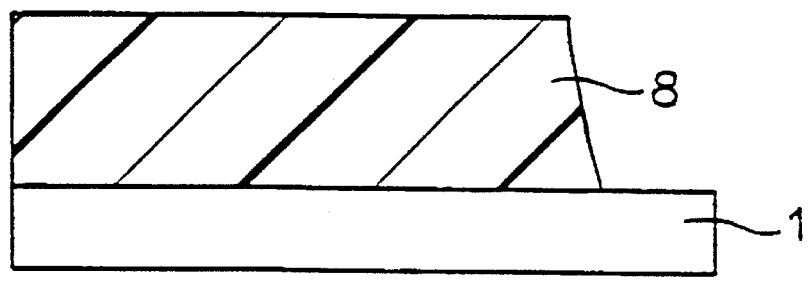
Figure 2C:
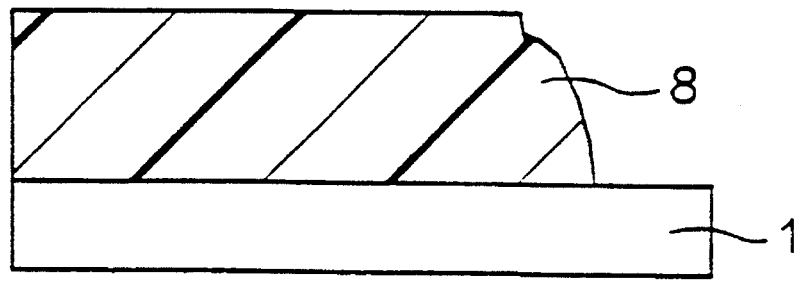

FIGS. 2A–2C show evaluation results of heat resistance of the obtained resist pattern. FIG. 2A shows the sectional shape of resist pattern 8 (50 µm×50 µm) after developing. FIG. 2B shows the sectional shape of the resist after the obtained resist pattern is baked at 120° C. for 5 minutes on a hot plate. FIG. 2C shows the sectional shape of a resist pattern after baking at 150° C. for 5 minutes. It can be appreciated that the obtained resist pattern is superior in heat resistance. The resist was prevented from sagging during heating of a subsequent process of ion implantation.

Referring to FIG. 1F, impurity ions (P$^+$) 9 are implanted at 3 MeV to the surface of semiconductor substrate 1 using resist pattern 8 as a mask. As a result, a buried impurity layer 9a is formed at a position of 2.4 µm in depth from the surface of semiconductor substrate 1. Reduction in vacuum due to gas generation from resist pattern 8 was not seen. According to the present method, a post bake process prior to ion implantation is not required. Also, a deep UV cure process is not required.

Referring to FIG. 1G, silicon substrate 1 was placed on hot plate 6, whereby resist pattern 8 was baked for 5 minutes at 120° C. The purpose of this baking process will be described afterwards.

Referring to FIGS. 1H and 1I, resist pattern 8 was removed by ashing using $O_2$ plasma.

EMBODIMENT 2

Embodiment 1 was described in which a resist composition having resolution and heat resistance improved was used. In the present embodiment, a resist composition is used in which resolution and heat resistance were lowered to a level where there is no problem to actual usage while the sensitivity was increased to a level equal to that of a resist for standard film thickness.

The used resist composition will be described. As a phenol resin, a condense-copolymerization of m-cresol, p-cresol, and formaldehyde was used. The composition ratio m/p was 5/5. The m-cresol unit and the p-cresol unit were arranged in random. The weight-average molecular weight of the copolymer was 10500 in polystyrene conversion (measured by GPC).

The photosensitive agent includes a resin portion formed from the following structural unit chemical formula to which the photosensitive functional groups are coupled.

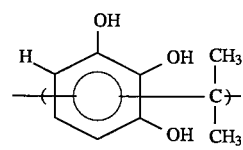

The above resin was a condense polymer of pyrogallol and acetone. The weight-average molecular weight was 1200 (measured by GPC) in polystyrene conversion. 55% of the hydroxyl group was esterified by 1, 2-naphthoquinone diazide-5-sulfonic acid. The 1, 2-naphthoquinone diazide-5-sulfonic portion was included by 0.4 mmol with respect to 1g of the entire resist solid (phenol resin and photosensitive agent combined). The phenol resin and the photosensitive agent were dissolved in methyl-3-methoxy propionate to produce a resist solution. The viscosity of the resist solution was appropriately prepared such that a desired film thickness is obtained when applied on a substrate.

The obtain resist solution was favorable in storage stability even though the viscosity was high. It could be applied uniformly on the substrate. Forming a resist pattern using this resist solution in accordance with a method identical to that of embodiment 1, the exposure amount for obtaining a desired mask dimension was 520 msec when the film thickness was 5.0 µm. The limited resolution was 1.5 µm line-and-space.

Figure 3A:
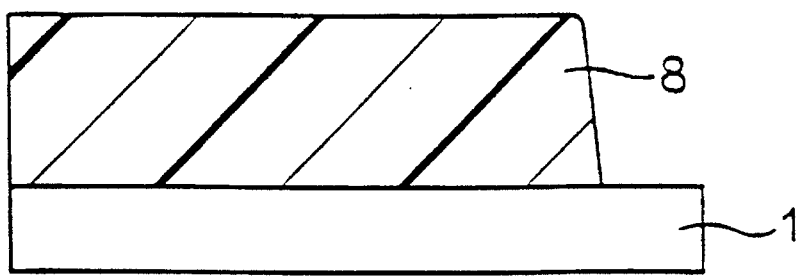
FIGS. 3A–3C show evaluation results of heat resistance of an obtained resist pattern.
Figure 3B:
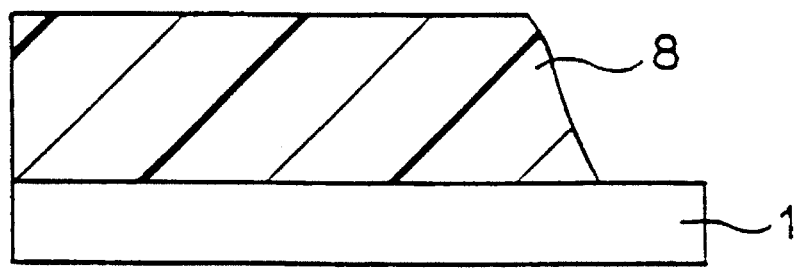
Figure 3C:
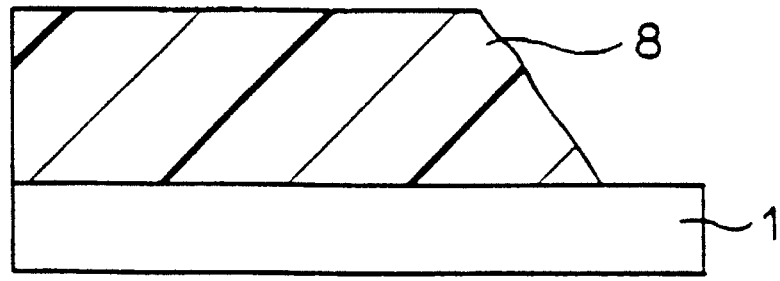

FIGS. 3A–3C indicate evaluation result of heat resistance of the obtained resist pattern. FIG. 3A shows a sectional shape of resist pattern (50 µm×50 µm) 8 after a developing step. FIG. 3B shows a sectional shape of resist pattern 8 subjected to a baking process for 5 minutes at 120° C. on a hot plate. FIG. 3C shows a sectional shape of resist pattern 8 after being baked for five minutes at 150° C. Gas generation was not seen at the time of exposure. The adherence between the substrate and the resist was favorable. Variation in sensitivity was not seen due to change in the time period after application until exposure. Furthermore, gas generation did not occur from the resist pattern during ion implantation. The present invention is not limited to the above-described composition of the embodiment including only a phenol resin, a photosensitive agent, and a solvent in the resist composition. Additions such as an enhancement for increasing the dissolution rate or for improving the applicability may be included. Although the above embodiments were described in which i-line light is used for exposure, exposure may be carried out using light of other wavelengths such as g-line.

EMBODIMENT 3

The present embodiment is provided to solve problems set forth in the following.

Figure 4A:
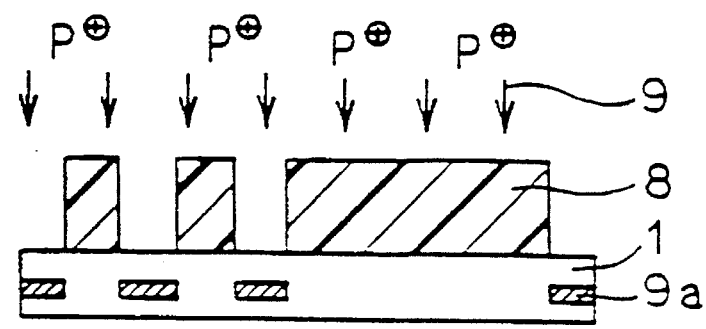
FIGS. 4A and 4B are partial sectional views of a semiconductor device showing impurity ions implanted to the surface of the semiconductor substrate at high energy using a resist pattern having a film thickness of at least 3 μm.
Figure 4B:
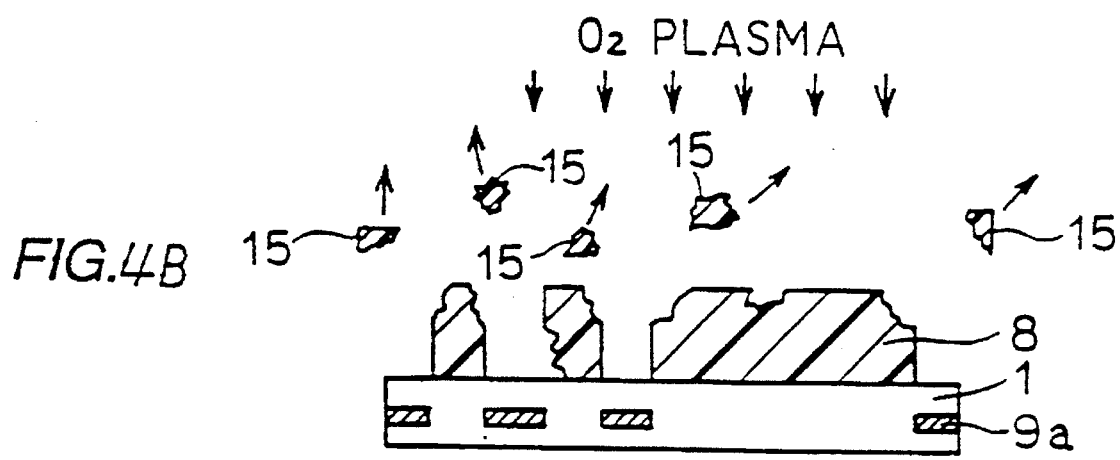

FIGS. 4A and 4B are partial sectional views of a semiconductor device showing implantation of impurity ions at high energy to the main surface of the semiconductor substrate using a resist pattern 8 having a film thickness of not less than 3 µm.

Referring to FIG. 4A, resist pattern 8 is degenerated by carbonization or the like when impurity ions 9 are implanted into resist pattern 8. Introduction of impurity ions 9 into resist pattern 8 causes stress in resist pattern 8. When resist pattern 8 is removed by ashing with $O_2$ plasma, fine pieces 15 of resist pattern 8 is peeled off from semiconductor substrate 1 to flow inside the ashing device as particles. These particles will contaminate the inside wall of the ashing device to deteriorate a subsequent semiconductor substrate entering the ashing device. The problem of particles 15 peeling off from resist pattern 8 to flow inside the ashing device is due mainly to the fact that the pressure is reduced in the chamber during ashing and that resist pattern 8 is bombarded by plasma. This problem becomes significant as the film thickness of resist pattern 8 is increased. The present embodiment is provided to solve this problem.

FIGS. 5A–5I show partial sectional views of a semiconductor device showing sequential processing steps of manufacturing a semiconductor device according to the present embodiment.

Figure 5A:
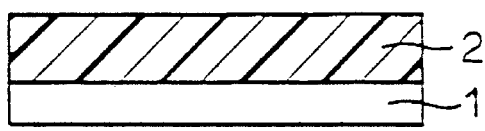
FIGS. 5A–5I are partial sectional views of a semiconductor device showing sequential processing steps of a method of manufacturing a semiconductor device according to another embodiment of the present invention.

Referring to FIG. 5A, a thermal oxide film is formed (not shown) of 300 Å in thickness on a semiconductor substrate 1 of 6 inch diameter. The surface of semiconductor substrate 1 is treated with hexamethyldisilazane (HMDS) to enhance adherence between the resist and semiconductor substrate 1. The HMDS process is carried out as follows. Semiconductor substrate 1 is placed on a hot plate to be heated to 80° C. At this temperature, vapor of hexamethyldisilazane was brought into contact with the surface of semiconductor substrate 1 for 60 minutes. The vapor of HMDS was obtained by bubbling nitride gas in hexamethyldisilazane.

A positive type resist for i-line, "resist A" (the resist used in embodiment 1) was applied on semiconductor substrate 1 to be prebaked at 80° C. for 90 seconds. As a result, a resist film 2 of 5.6 µm in thickness was obtained.

Figure 5B:
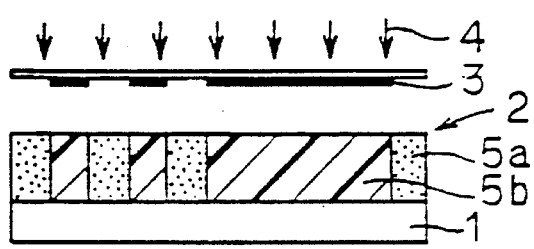

Referring to FIG. 5B, resist film 2 was selectively exposed with an i-line stepper "NSR175517A" (a product of Nikon Corporation) using a reticle 3 having a desired shape of pattern.

Figure 5C:
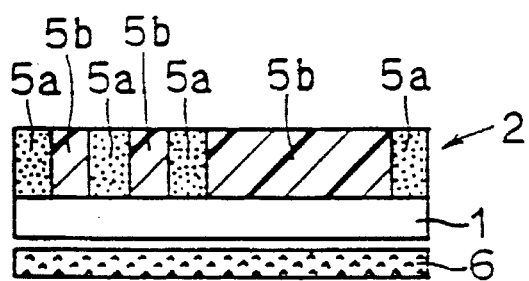

Referring to FIG. 5C, semiconductor substrate 1 is placed on hot plate 6 after exposure to be subjected to a post exposure baking (PEB) process for 90 seconds at 120° C.

Figure 5D:
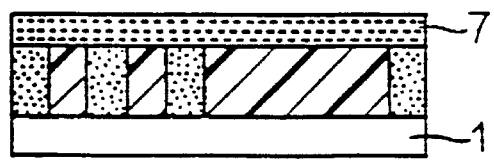

Referring to FIG. 5D, paddle developing is carried out 4 times for 100 seconds at 25° C. using a tetramethylammonium hydroxide developer 7 "NMD-3", 2.38 wt % (a product of Tokyo Ohka Kogyo Co., Ltd.). Then rinsing is carried out with water to obtain a resist pattern 8.

Figure 5E:
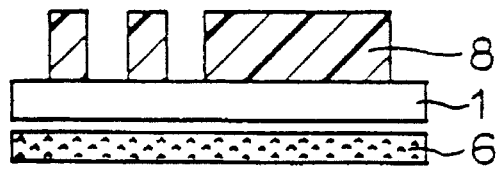

Referring to FIG. 5E, semiconductor substrate 1 is placed on hot plate 6 to be baked for 120 seconds at 110° C. to remove water introduced in resist pattern 8 during the rinsing step.

Figure 5F:
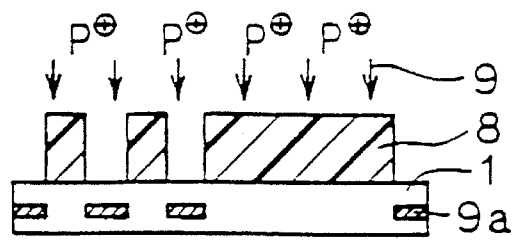

Referring to FIG. 5F, impurity ions 9 (phosphorus ions) are implanted at $1\times10^{14}/cm^2$ onto the surface of semiconductor substrate 1 at an ion energy of 3 MeV and at an ion current of 100 µA using resist pattern 8 as a mask. As a result, a buried impurity layer 9a is formed at a deep position in semiconductor substrate 1.

Figure 5G:
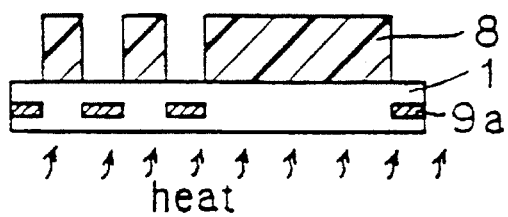

Referring to FIG. 5G, thermal treatment of resist pattern 8 was carried out after ion implantation under various conditions as shown in Table 1.

TABLE 1

| | Heat Process Conditions | | | |
|---|---|---|---|---|
| Embodiment | Heating Method/ Pressure | Temperature | Time | Evaluation (1) |
| Comparable Example 1 | No Heat Process | | | C |
| Present Invention 1 | Hot Plate/ Atmospheric Pressure | 120° C. | 3 min. | B |
| Present Invention 2 | Hot Plate/ Atmospheric Pressure | 120° C. | 7 min. | A |
| Present Invention 3 | Hot Plate/ Atmospheric Pressure | 130° C. | 3 min. | A |
| Present Invention 4 | Hot Plate/ Atmospheric Pressure | 150° C. | 3 min. | A |
| Present Invention 5 | Oven/ Atmospheric Pressure | 120° C. | 60 min. | B |
| Present Invention 6 | Oven/ Atmospheric Pressure | 120° C. | 90 min. | A |
| Present Invention 7 | Oven/$10^{-3}$ Torr | 120° C. | 60 min. | A |
| Present Invention 8 | Oven/$10^{-3}$ Torr | 120° C. | 30 min. | B |
| Present Invention 9 | Oven/$10^{-3}$ Torr | 120° C. | 30 min. | A |
| Present Invention 10 | Oven/ Atmospheric Pressure | 130° C. | 60 min. | A |
| Present Invention 11 | Oven/ Atmospheric Pressure | 150° C. | 30 min. | A |

(1) Evaluation was made whether particles of the resist pattern are peeled off from the substrate to flow therein.

A: None

B: None or little

C: Many

Figure 5H:
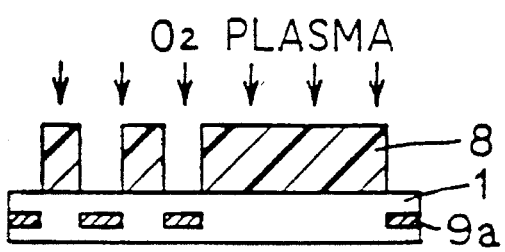
Figure 5I:
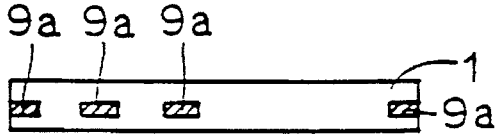

Referring to FIGS. 5H and 5I, resist pattern 8 was removed by ashing with a plasma including oxygen. Ashing experiment for carried out for each sample subjected to thermal treatment under various conditions indicated in Table 1. Determination was made whether particles of resist pattern 8 were peeled off the substrate to flow inside the ashing device. The result is shown in Table 1.

A product of Tokyo Ohka Kogyo Coo, Ltd. called TCA-2400 was used as the ashing device. The ashing process was carried out under the following conditions.

Gas type: $O_2$

Gas flow rate: 150 sccm

Pressure: 0.30 Torr

R. F. voltage: 250 W

Stage temperature: 60° C.

Evaluation of whether particles of the resist film are peeled off from the substrate to flow was carried out by stopping the ashing process for 1 minute to observe visually the surface of the substrate. The ashing rate under the above-described ashing conditions was 0.8 μm/min.

Table 1 also shows the results of the present invention and the conventional method (comparable example 1) in the embodiment 3.

EMBODIMENT 4

An experiment identical to embodiment 3 was carried out with a different type of the resist.

As a resist, an i-line negative type resist, "resist B" was used. Prebaking was carried out at 90° C. for 120 seconds. The thickness of the resist film was 5.6 μm. PEB was carried out at 90° C. for 120 seconds. Developing was carried out by a spray method at 25° C. for 60 seconds. The patterning condition of the resist, the ion implantation condition, thermal treatment condition (conditions shown in the following Table 2), ashing condition, and the evaluation method of whether particles of resist patterns peeled off from the substrate to flow were all identical to the conditions of embodiment 3. The result is shown in Table 2.

TABLE 2

| Embodiment | Heating Method/ Pressure | Temperature | Time | Evaluation (1) |
|---|---|---|---|---|
| Comparable Example 2 | No Heat Process | | | C |
| Present Invention 12 | Hot Plate/ Atmospheric Pressure | 120° C. | 3 min. | B |
| Present Invention 13 | Hot Plate/ Atmospheric Pressure | 120° C. | 7 min. | A |
| Present Invention 14 | Hot Plate/ Atmospheric Pressure | 130° C. | 3 min. | A |
| Present Invention 15 | Hot Plate/ Atmospheric Pressure | 150° C. | 3 min. | A |
| Present Invention 16 | Oven/ Atmospheric Pressure | 120° C. | 60 min. | B |
| Present Invention 17 | Oven/ Atmospheric Pressure | 120° C. | 90 min. | A |
| Present Invention 18 | Oven/$10^{-3}$ Torr | 120° C. | 60 min. | A |

TABLE 2-continued

| Embodiment | Heating Method/ Pressure | Temperature | Time | Evaluation (1) |
|---|---|---|---|---|
| Present Invention 19 | Oven/$10^{-3}$ Torr | 120° C. | 30 min. | B |
| Present Invention 20 | Oven/$10^{-3}$ Torr | 120° C. | | |
| Present Invention 21 | Oven/ Atmospheric Pressure | 130° C. | 60 min. | A |
| Present Invention 22 | Oven/ Atmospheric Pressure | 150° C. | 30 min. | A |

(1) Evaluation was made whether particles of the resist pattern are peeled off from the substrate to flow.

A: None

B: None or little

C: Many

EMBODIMENT 5

The present embodiment was carried out to identify how the implantation amount of impurity ions affect the peeling off of the resist.

As a resist, an i-line positive type resist "resist C" (the resist used in embodiment 2) was used. The prebaking process was carried out on a hot plate at 80° C. for 90 seconds. The film thickness of the resist was 3.6 μm. Ion implantation was carried out at an ion energy of 1 MeV and an ion current of 120 μA. As shown in the following Table 3, the implantation amount of phosphorus ions were changed from $1\times10^{13}/cm^2$ to $1\times10^{16}/cm^2$. Simultaneously, the thermal treating conditions of the resist pattern were changed as shown in Table 3. The other processing conditions were identical to those of embodiment 3. The result is shown in Table 3.

TABLE 3

| Embodiment | Ion Implantation | Heating Method/ Pressure | Temperature | Time | Evaluation (1) |
|---|---|---|---|---|---|
| Comparable Example 3 | $1 \times 10^{13}/cm^2$ | No Heat Process | | | C |
| Comparable Example 4 | $1 \times 10^{14}/cm^2$ | No Heat Process | | | C |
| Comparable Example 5 | $1 \times 10^{15}/cm^2$ | No Heat Process | | | C |
| Present Invention 23 | $1 \times 10^{15}/cm^2$ | Oven/ Atmospheric Pressure | 150° C. | 30 min. | B |
| Present Invention 24 | $1 \times 10^{15}/cm^2$ | Oven/ Atmospheric Pressure | 150° C. | 60 min. | A |
| Present Invention 25 | $1 \times 10^{16}/cm^2$ | Oven/ Atmospheric Pressure | 150° C. | 60 min. | B |
| Present Invention 26 | $1 \times 10^{16}/cm^2$ | Oven/ Atmospheric Pressure | 150° C. | 90 min. | A |
| Present Invention | $1 \times 10^{16}/cm^2$ | Oven/ $10^{-5}$ Torr | 150° C. | 30 min. | A |

TABLE 3-continued

| Embodiment | Ion Implantation | Heat Process Conditions | | | Evaluation (1) |
|---|---|---|---|---|---|
| | | Heating Method/ Pressure | Temperature | Time | |
| Present Invention 27 | $1 \times 10^{15}/cm^2$ | Hot Plate/ Atmospheric Pressure | 130° C. | 7 min. | B |
| Present Invention 28 | $1 \times 10^{16}/cm^2$ | Hot Plate/ Atmospheric Pressure | 140° C. | 5 min. | B |
| Present Invention 29 | $1 \times 10^{16}/cm^2$ | Hot Plate/ Atmospheric Pressure | 140° C. | 7 min. | A |
| Present Invention 30 | $1 \times 10^{16}/cm^2$ | Hot Plate/ Atmospheric Pressure | 150° C. | 3 min. | A |
| Present Invention 31 | | | | | |

(1) Evaluation was made whether particles of the resist pattern are peeled off from the substrate to flow.

A: None
B: None or little
C: Many

EMBODIMENT 6

The present invention was provided to solve problems set forth in the following.

Figure 6A:
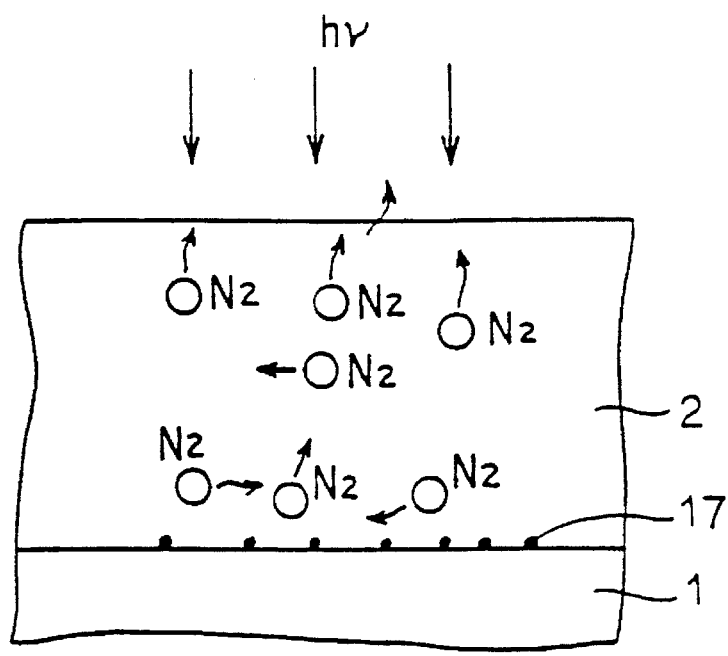
FIGS. 6A–6C are diagrams for describing the cause of gas generation recognized at the time of directing light on a resist film.

Referring to FIG. 6A, a resist film 2 having a film thickness of not less than 3 μm is formed on a semiconductor substrate (silicon substrate) 1. Light is directed to resist film 2 to obtain a pattern. If the film thickness of resist film 2 is increased, the amount of the photosensitive agent per unit area of resist film 2 is increased. Also, the required amount of exposure per unit area is increased. This means that the amount of $N_2$ gas per unit area generated at the time of exposure is increased.

Figure 6B:
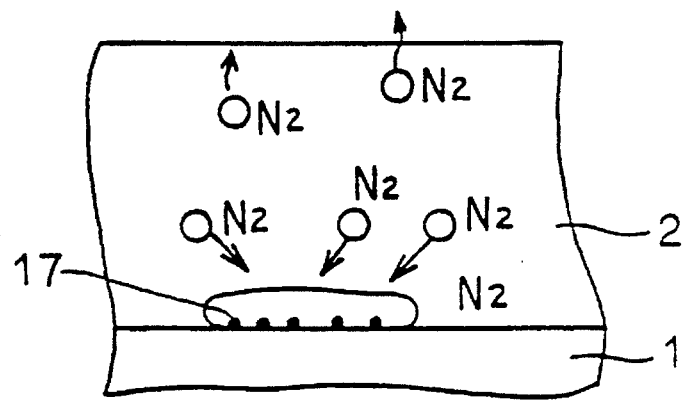

Referring to FIG. 6B, the generated $N_2$ gas is not easily discharged outside of resist film 2 due to its great thickness. As a result, the $N_2$ gas tends to assemble with the adsorbed atom 17 at the interface of resist film and silicon substrate 1 as a nucleus.

Figure 6C:
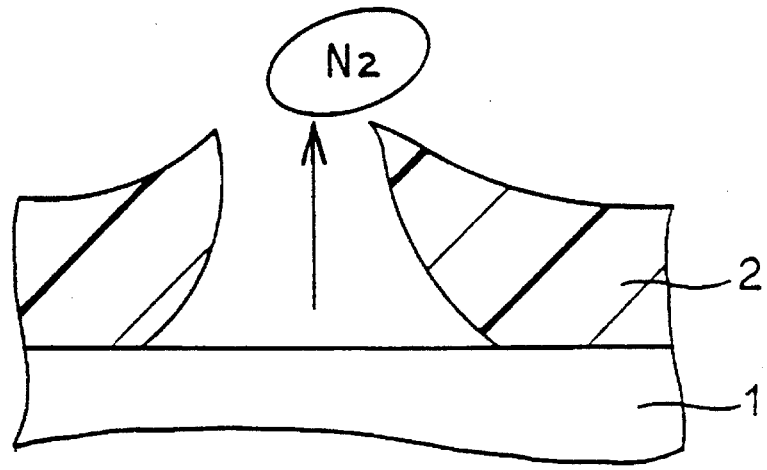

Referring to FIG. 6C, $N_2$ gas is concentrated at the interface of resist film 2 and silicon substrate 1. The expansion of $N_2$ gas will damage resist film 2 to cause particles of the resist film to be spattered as contaminants, resulting in a portion of the pattern being missing. The particles will contaminate the interior of the exposure device. The particles in the exposure device will contaminate a subsequent semiconductor substrate placed in the device during exposure.

This problem was significant as the film thickness of the resist was increased. Gas generation is due to adsorbed atoms or a natural oxide film on the surface of the substrate.

The present embodiment was provided to remove adsorbed atoms or a natural oxide film on the surface of the substrate.

FIGS. 7A–7I are partial sectional views of a semiconductor device showing various steps of a method of manufacturing a semiconductor device according to the present embodiment.

Figure 7A:
FIGS. 7A–7J are partial sectional views of a semiconductor device showing sequential processing steps of a method of manufacturing a semiconductor device according to a further embodiment of the present invention.

Referring to FIG. 7A, a silicon semiconductor substrate 1 is prepared. A thermal oxide film of 300 Å in thickness (not shown) is formed on the surface of semiconductor substrate 1. The surface of semiconductor substrate 1 was rinsed using various rinsing agents shown in the following Table 4. After the rinsing process, a rinsing process with water at 25° C. was carried out for ten minutes. Then, semiconductor substrate 1 was dried with vapor of isopropyl alcohol. Table 5 describes the rinsing sequence where a plurality of rinsing agents are combined. The surface of the semiconductor substrate rinsed by the rinsing method shown in Tables 4 and 5 was processed with HMDS. The HMDS process was carried out as follows. The semiconductor substrate was placed on a hot plate to be heated to 80° C. Then, HMDS vapor was brought into contact with the surface of the semiconductor substrate for 60 seconds.

A semiconductor substrate not treated to a HMDS process was also prepared for the experiment.

TABLE 4

| Rinsing Method | | | | |
|---|---|---|---|---|
| Rinsing Method | Rinsing Agent | Composition | Processing Temperature | Processing Time |
| (1) | $NH_4OH/H_2O_2/H_2O$ | 1/25/275 | 25° C. | 10 min. |
| (2) | $NH_4OH/H_2O_2/H_2O$ | 1/25/275 | 25° C. | 30 min. |
| (3) | $NH_4OH/H_2O_2/H_2O$ | 1/25/275 | 40° C. | 10 min. |
| (4) | $HCl/H_2O_2/H_2O$ | 1/1/5 | 25° C. | 10 min. |
| (5) | $H_2SO_4/H_2O_2/H_2O$ | 1/1/5 | 25° C. | 10 min. |
| (6) | $HCl/HNO_3/H_2O$ | 1/1/5 | 25° C. | 10 min. |
| (7) | $HF/H_2O$ | 1/100 | 25° C. | 3 min. |
| (8) | $HF/H_2O$ | 1/100 | 25° C. | 5 min. |
| (9) | $HF/H_2O_2/H_2O$ | 1/1/100 | 25° C. | 1 min. |
| (10) | $HF/H_2O_2/H_2O$ | 1/1/100 | 25° C. | 3 min. |

TABLE 5

| Rinsing Method | | | | Rinsing Method | |
|---|---|---|---|---|---|
| Rinsing Sequence | | | | (11) | (12) |
| o $H_2SO_4/H_2O_2/H_2O$ ↓ | | 130° C. | 10 min. | — | Processed |
| o Rinse ↓ | | 25° C. | 10 min. | — | Processed |
| o $NH_4OH/H_2O_2/H_2O$ ↓ | | 45° C. | 10 min. | Processed | Processed |
| o Rinse ↓ | | 25° C. | 10 min. | Processed | Processed |
| o $HCl/H_2O_2/H_2O$ ↓ | | 75° C. | 10 min. | Processed | Processed |
| o Rinse | | 25° C. | 10 min. | Processed | Processed |

Figure 7B:
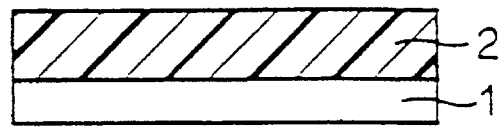

Referring to FIG. 7B, a resist film 2 was formed on semiconductor substrate 1. For the used resists, resist A which is an i-line naphthoquinone diazide-novolac type positive type resist (resist of high resolution used in standard film thickness), resist B (the resist used in embodiment 1 where the photosensitive material of resist A is reduced to ¾), resist C.(used in embodiment 2), and resist D (negative type resist) were selected. The photosensitive material of resist B was approximately ¾ of resist A. In resist B, reduction of the amount of generated $N_2$ gas was expected. The resist was prebaked under the prebaking conditions shown in the following Table 6.

TABLE 6

Resist Patterning Conditions

| Resist | Prebake Conditions | Bake Conditions After Exposure and Before Develop |
| --- | --- | --- |
| Resist A | 80° C. 90 sec. | 120° C. 90 sec. |
| Resist B | 80° C. 90 sec. | 120° C. 90 sec. |
| Resist C | 80° C. 90 sec. | 120° C. 90 sec. |
| Resist D | 90° C. 90 sec. | 110° C. 90 sec. |

Figure 7C:
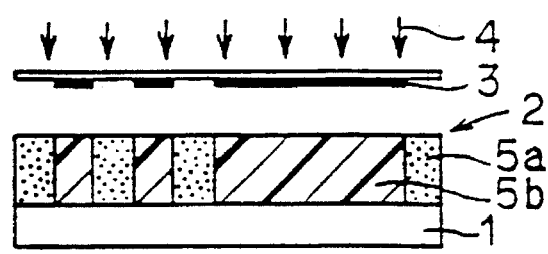

Preliminary experiments were carried out using these resists prior to the process shown in FIG. 7C. In other words, evaluation of whether particles of the resist was spattered during exposure was carried out. This evaluation was carried out by exposure without a reticle for every 10 msec from 30 msec to 2000 msec. The presence/absence of spatter of resist particles was observed visually. The evaluation of spatter of resist particles was carried out by obtaining the minimum exposure amount where spatter of resist particles begin to occur. The obtained result is shown in the following Table 7 with comparable examples.

Method and Evaluation Result of Present Invention and Comparable Example

| Embodiment | Rinsing Method | HMDS Method | Method Resist | Resist Thickness | Evaluation Result Minimum Exposure |
| --- | --- | --- | --- | --- | --- |
| Present Invention 1 | (1) | Processed | Resist A | 5.6 μm | 1750 msec |
| Present Invention 2 | (2) | Processed | Resist A | 5.6 μm | No Spatter |
| Present Invention 3 | (3) | Processed | Resist A | 5.6 μm | No Spatter |
| Present Invention 4 | (4) | Processed | Resist A | 5.6 μm | No Spatter |
| Present Invention 5 | (5) | Processed | Resist A | 5.6 μm | No Spatter |
| Present Invention 6 | (6) | Processed | Resist A | 5.6 μm | No Spatter |
| Present Invention 7 | (7) | Processed | Resist A | 5.6 μm | 1870 msec |
| Present Invention 8 | (8) | Processed | Resist A | 5.6 μm | No Spatter |
| Present Invention 9 | (9) | Processed | Resist A | 5.6 μm | 1900 msec |
| Present Invention 10 | (10) | Processed | Resist A | 5.6 μm | No Spatter |
| Present Invention 11 | (11) | Processed | Resist A | 5.6 μm | No Spatter |
| Present Invention 12 | (12) | Processed | Resist A | 5.6 μm | No Spatter |
| Present Invention 13 | (1) | Processed | Resist A | 3.6 μm | No Spatter |
| Present Invention 14 | (1) | No Processed | Resist A | 5.6 μm | No Spatter |
| Present Invention 15 | (1) | Processed | Resist B | 5.6 μm | No Spatter |
| Present Invention 16 | (11) | Processed | Resist B | 5.6 μm | No Spatter |
| Present Invention 17 | (12) | Processed | Resist B | 5.6 μm | No Spatter |
| Present Invention 18 | (1) | Processed | Resist C | 5.6 μm | No Spatter |
| Present Invention 19 | (11) | Processed | Resist C | 5.6 μm | No Spatter |
| Present Invention 20 | (12) | Processed | Resist C | 5.6 μm | No Spatter |
| Present Invention 21 | (1) | Processed | Resist D | 5.6 μm | No Spatter |
| Present Invention 23 | (11) | Processed | Resist D | 5.6 μm | No Spatter |
| Comparable Example 1 | — | Processed | Resist A | 3.6 μm | 370 msec |
| Comparable Example 2 | — | Not | Resist A | 3.6 μm | 800 msec |
| Comparable Example 3 | — | Not Processed | Resist A | 5.6 μm | 420 msec |
| Comparable Example 4 | — | Processed | Resist B | 5.6 μm | 1100 msec |
| Comparable Example 5 | — | Not Processed | Resist B | 5.6 μm | 1870 msec |

It was confirmed that particles of the resist were not seen by carrying out a rinsing process under appropriate rinsing conditions.

Referring to FIG. 7C, resist 2 was exposed using an i-line stepper "NSR175517A" (a product of Nikon Corporation) using reticle 3. Particles of the resist were not seen in those having the surface of the substrate rinsed by appropriate rinsing conditions.

Figure 7D:
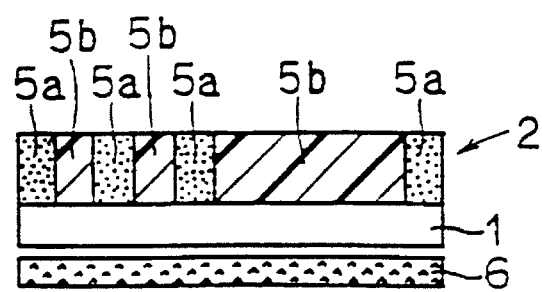

Referring to FIG. 7D, semiconductor substrate 1 containing exposed resist portions 5a and non-exposed resist portions 5b is placed on hot plate 6 to be subjected to a baking step after exposure and before developing under the conditions shown in Table 6.

Figure 7E:
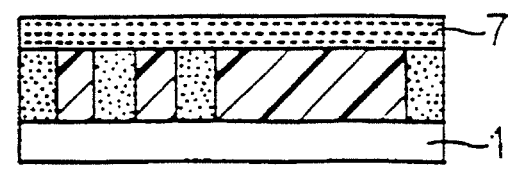

Referring to FIG. 7E, a developing process was carried out by a paddle developing method (4 times) at 25° C. for 100 seconds using a developer 7 "NMD-3" 2.38 wt % (Tokyo Ohka Kogyo Co., Ltd.).

Figure 7F:
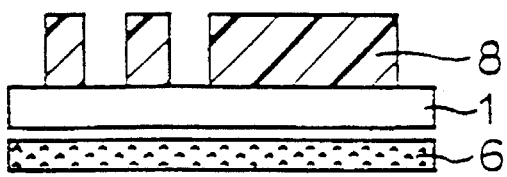
Figure 7G:
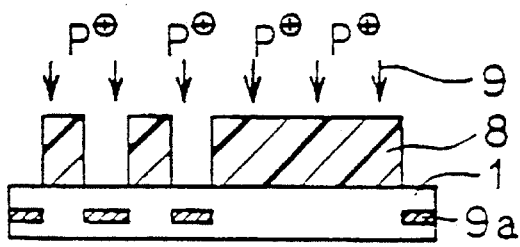

Referring to FIG. 7F, semiconductor substrate 1 is placed on hot plate 6, whereby resist pattern 8 is baked.

Using resist pattern 8 as a mask, impurity ions 9 are implanted at high energy into the main surface of semiconductor substrate 1 to form a buried impurity layer 9a at a deep position of semiconductor substrate 1.

Figure 7H:
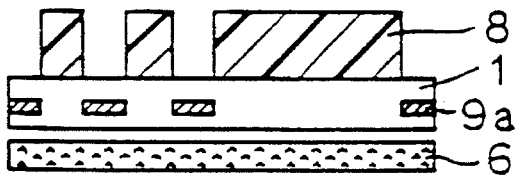

Referring to FIG. 7H, semiconductor substrate 1 was placed on hot plate 6, whereby resist pattern 8 was baked.

Figure 7I:
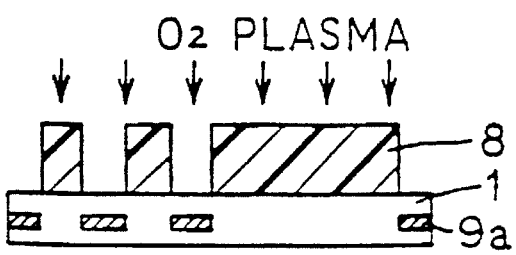
Figure 7J:
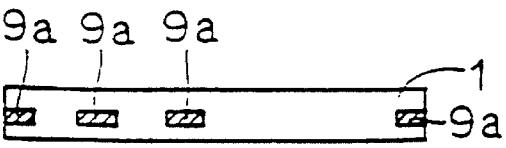
Figure 8A:
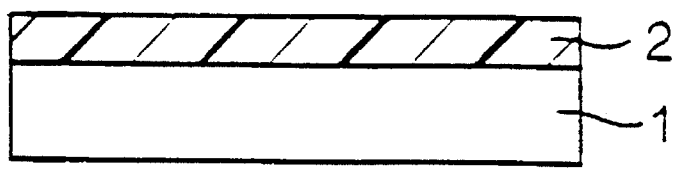
FIGS. 8A–8E are partial sectional views of a semiconductor device showing sequential processing steps of a method of forming an impurity layer near the surface of a semiconductor substrate.
Figure 8B:
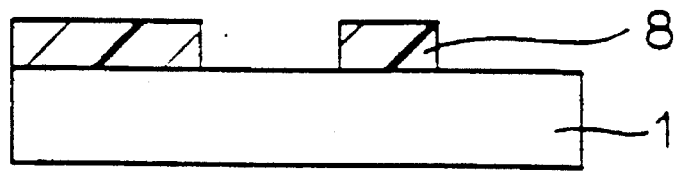
Figure 8C:
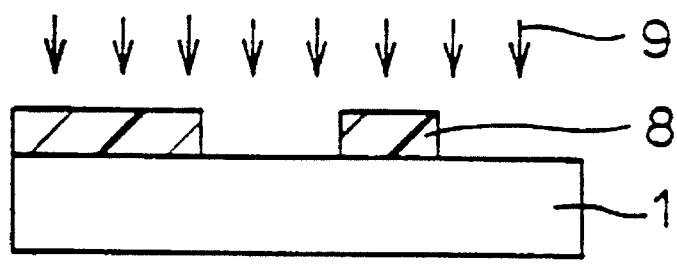
Figure 8D:
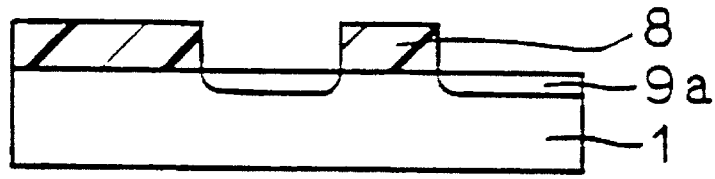
Figure 8E:
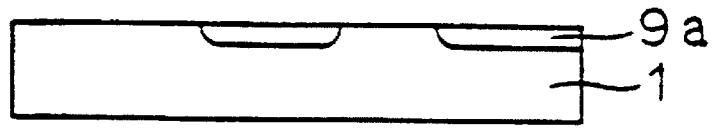
Figure 9:
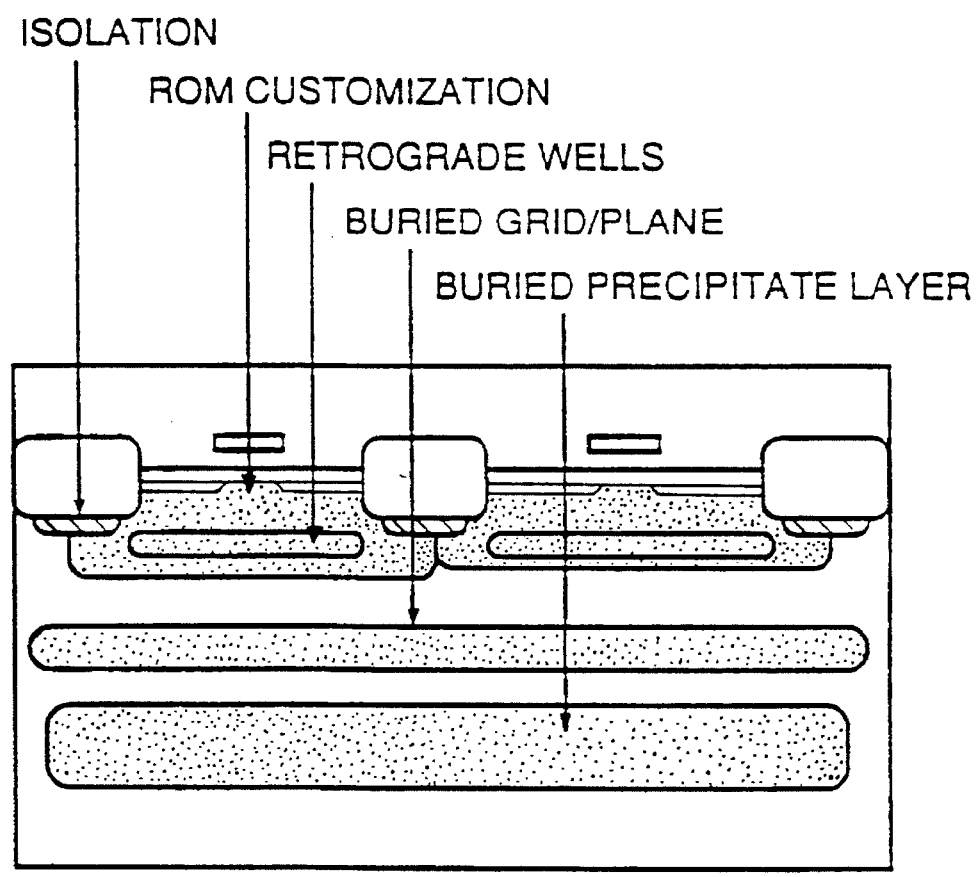
FIG. 9 is a diagram for describing application of the present invention to a silicon device of high energy implantation.
Figure 10A:
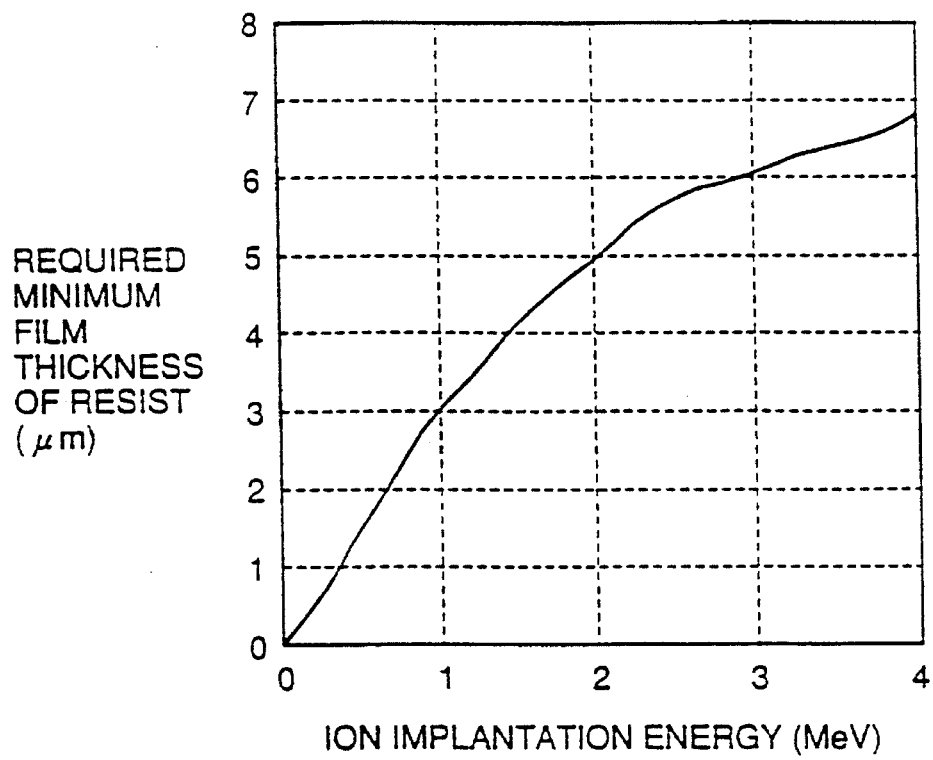
FIGS. 10A–10B are graphs showing the relationship between ion implantation energy and the required minimum film thickness of a resist as a mask in implanting boron ions and phosphorus ions, respectively, to the surface a semiconductor substrate using a resist mask.
Figure 10B:
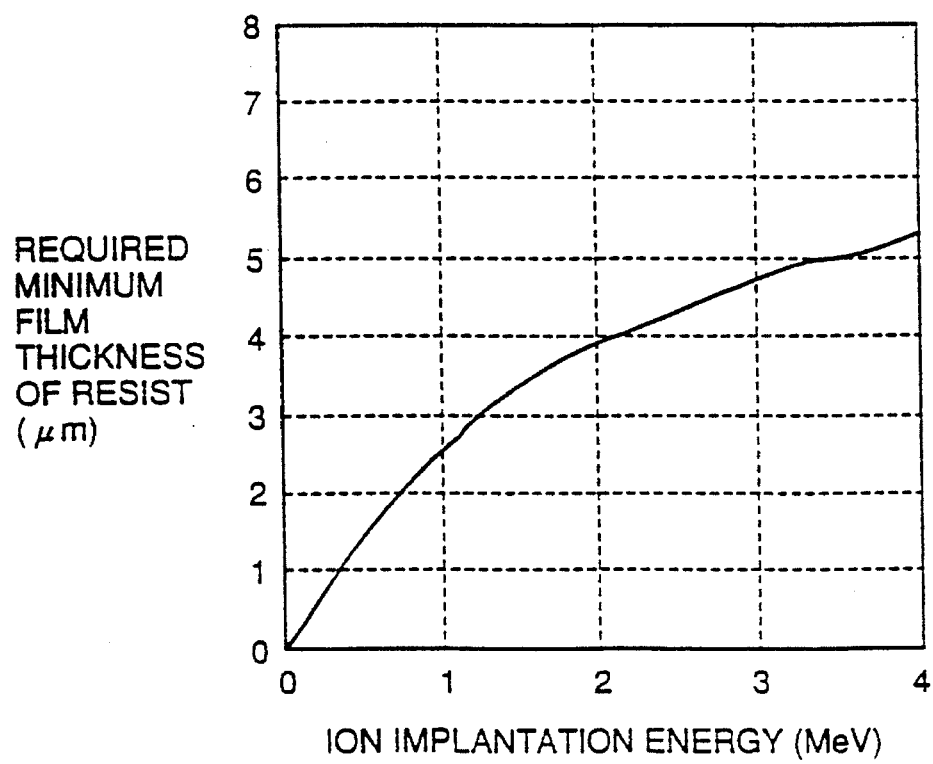
Figure 11:
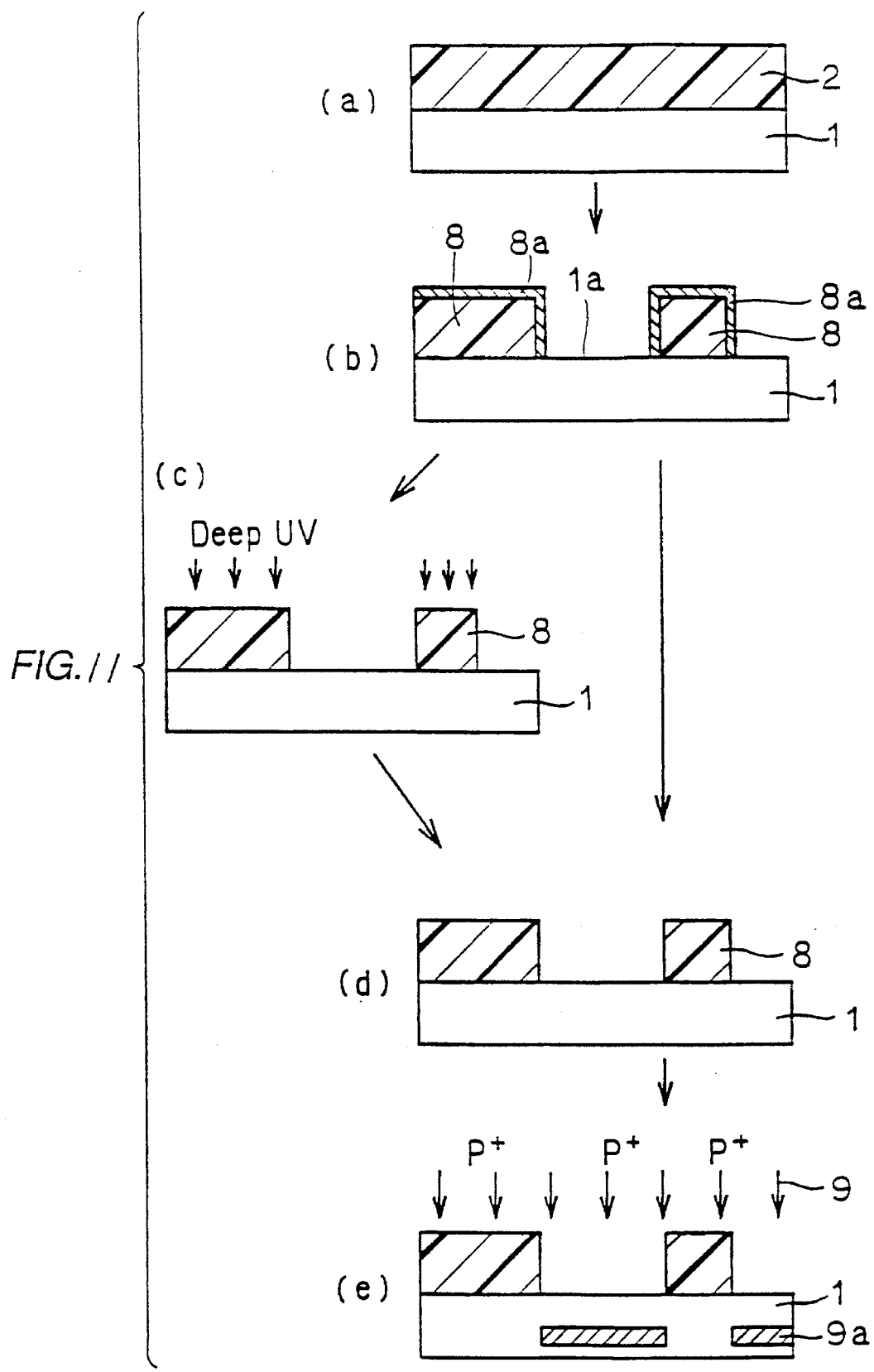
FIG. 11 shows the steps of forming a buried impurity layer in a semiconductor substrate using a mask formed by resist AZ4620.
Figure 12:
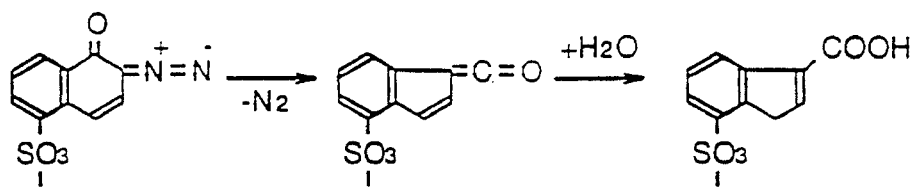
FIG. 12 shows the reaction formula of photo decomposition of a photosensitive agent.
Figure 13:
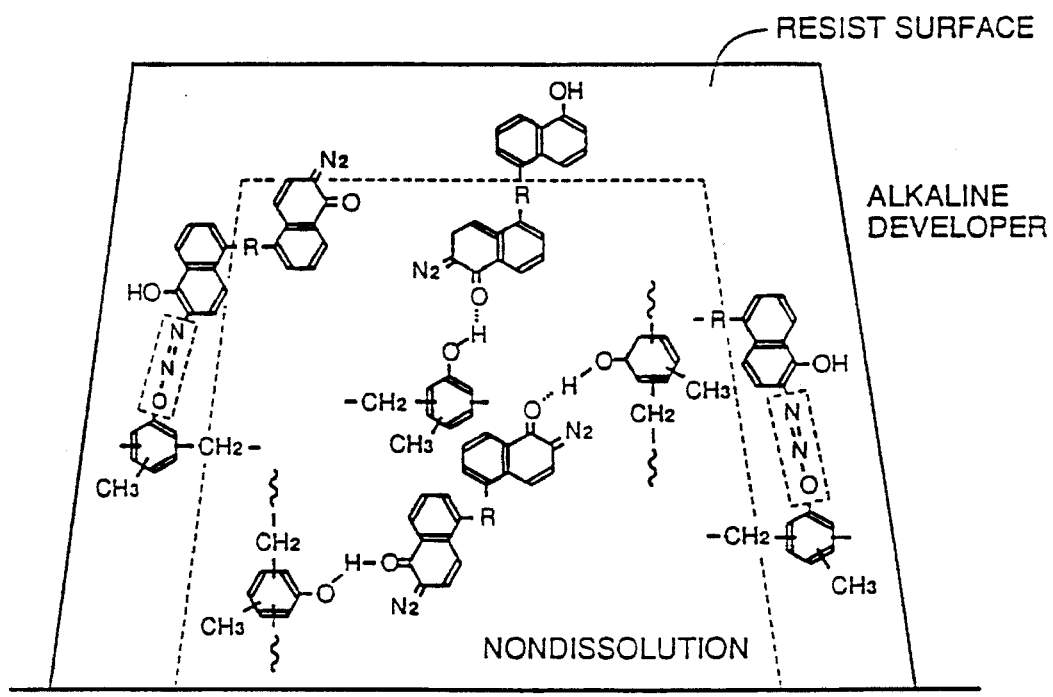
FIG. 13 shows azoxy coupling generated at the surface of the resist caused by an alkaline developer in contact with the resist surface.
Figure 14:
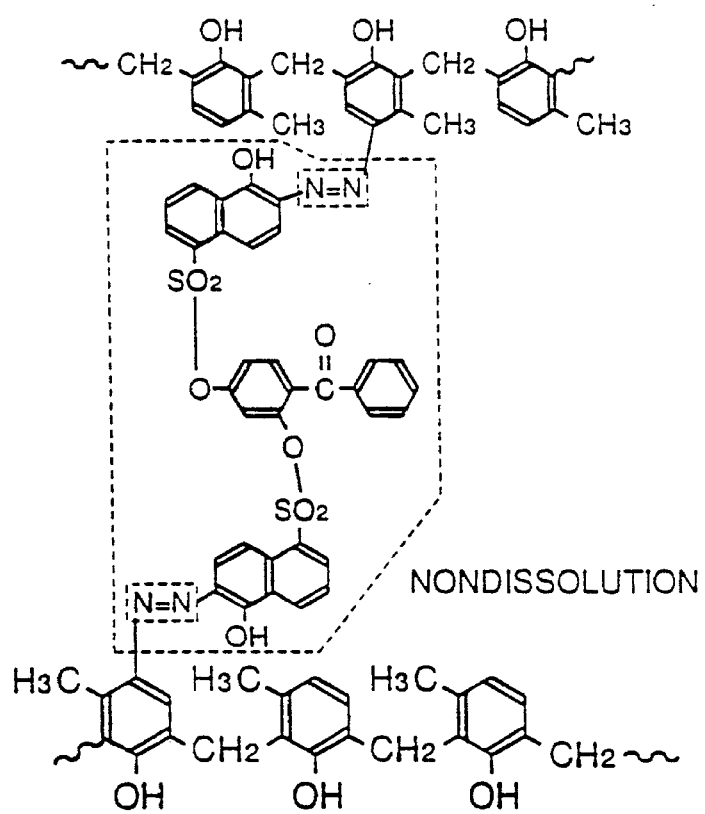
FIG. 14 shows azo coupling generated at the resist surface caused by an alkaline developer coming into contact with the surface of the resist.
Figure 15:
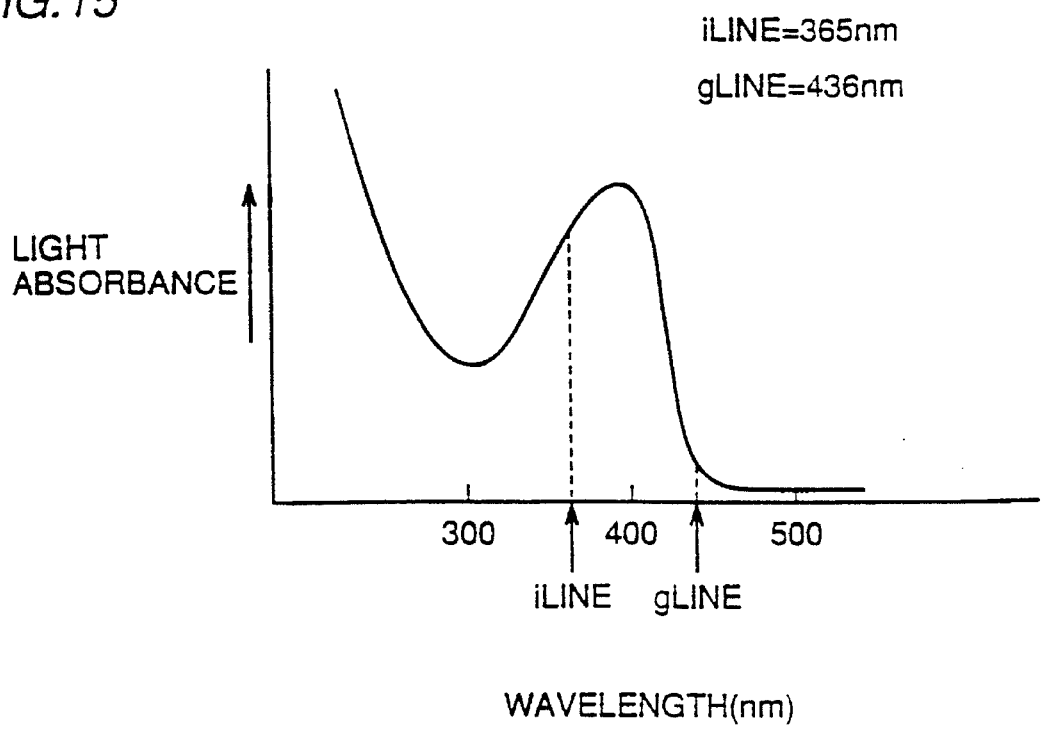
FIG. 15 is a graph showing the relationship between light wavelength and light absorption of the resist.
Figure 16A:
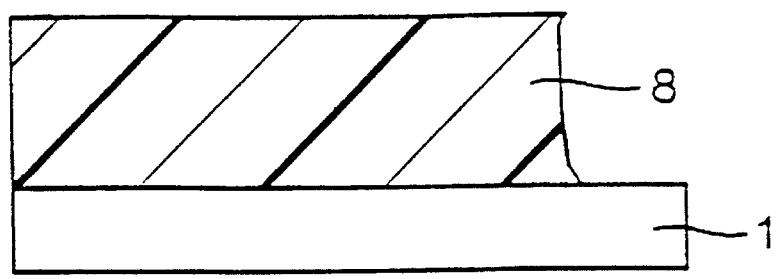
FIGS. 16A–16C show the evaluation results of heat resistance of a conventional resist pattern.
Figure 16B:
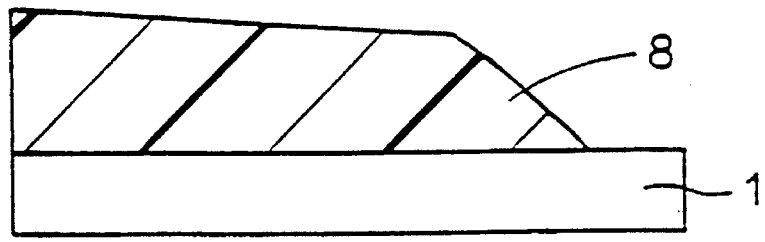
Figure 16C:
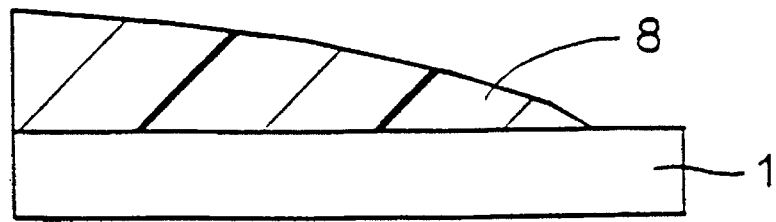
Figure 18:
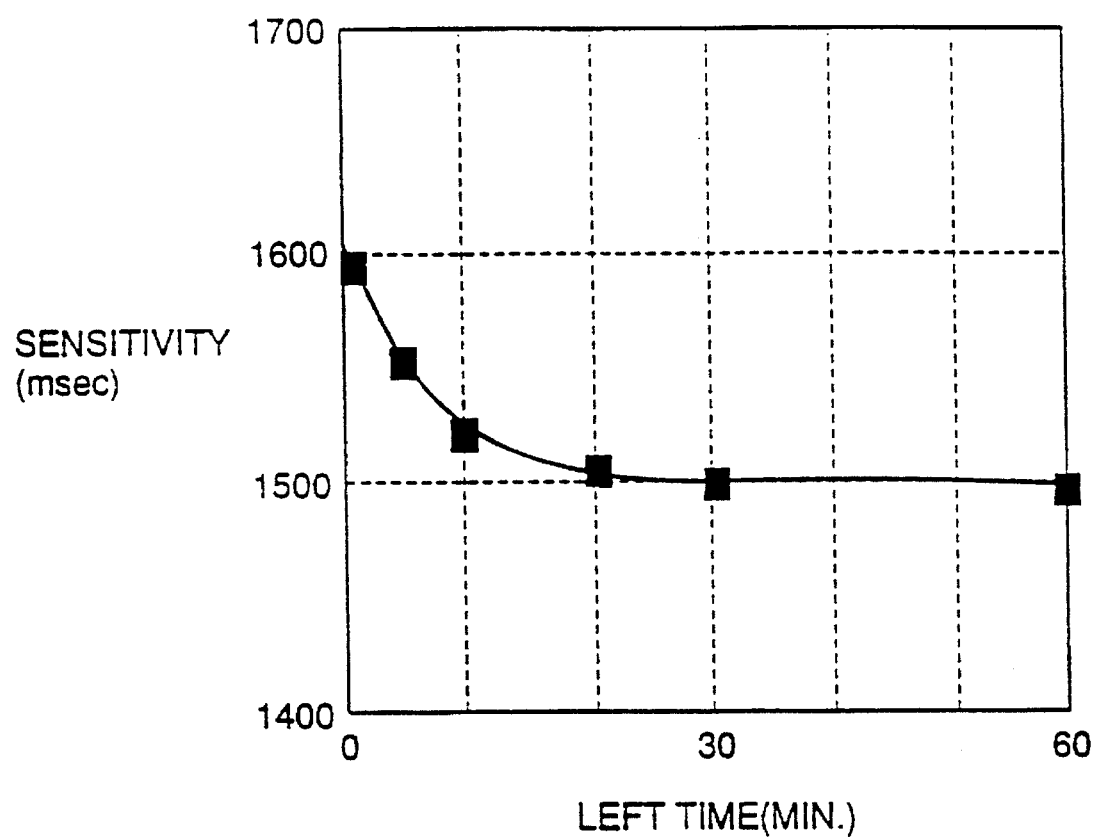
FIG. 18 is a graph showing the relationship between the elapse of time from application of a resist solution onto a substrate until exposure, and sensitivity.
Figure 19A:
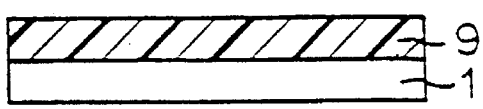
FIGS. 19A–19I are diagrams for describing the prior art of obtaining a resist pattern having a film thickness of more than 3 μm by stacking 2 layers of resists.
Figure 19B:
Figure 19C:
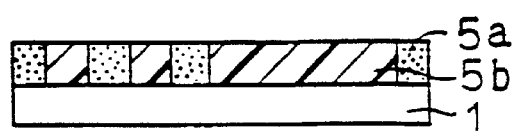
Figure 19D:
Figure 19E:
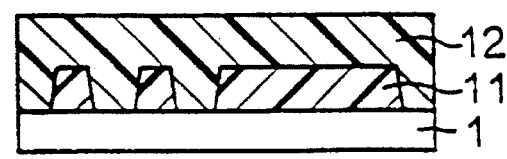
Figure 19F:
Figure 19G:
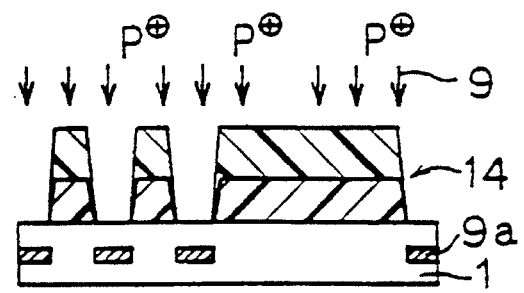
Figure 19H:
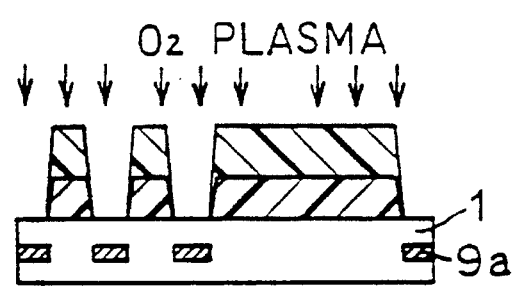
Figure 19I:
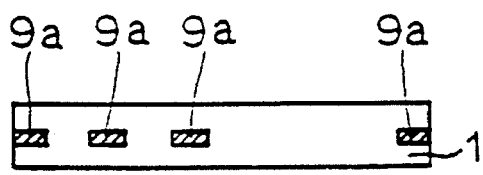

Referring to FIGS. 7I and 7J, resist pattern 8 was removed by ashing using $O_2$ plasma.

The present invention is not limited to the present embodiment in which the surface of the semiconductor substrate was directly rinsed with a rinsing agent. It may be processed with a solvent prior to rinsing with a rinsing agent.

According to a method of manufacturing a semiconductor substrate of the said one aspect, the resist film is baked at a temperature of 110° C.–130° C. after exposure and before developing. Therefore, the solvent remaining in the resist film is removed. Because the resist pattern is baked at 100° C.–130° C. after the developing process, moisture introduced in the resist film during the developing process and the rinsing step can be removed. This prevents generation of gas during ion implantation. The post baking process carried out before ion implantation and the deep UV cure step carried out in conventional cases can be omitted. Furthermore, adherence between the resist film and the substrate is improved.

According to the method of manufacturing a semiconductor device of the said another aspect, a phenol resin including at least 40 mole % of meta cresol unit and a weight-average molecular weight of at least 10000 in polystyrene conversion is used as the structural component of the resist film. The usage of meta creosol allows a resin of high molecular weight to improve heat resistance. Also, because the hydroxyl groups are arranged outwards in the resin, adherence between the substrate and the resin is improved. The quinone diazide portion of the photosensitive agent in the resist film is included by 0.40 mmol–0.55 mmol with respect to 1g of the entire resist solid. This reduces the absorption to reduce the gas generation amount per unit area. Because a base in which photosensitive functional groups are coupled is the resin having a weight-average molecular weight of 500–2000 in polystyrene conversion, heat resistance of the resist is improved. As a result, a resist pattern of high heat resistance can be obtained.

According to the method of manufacturing a semiconductor device of the said further aspect, the resist pattern is heated to a temperature exceeding 120° C. after implantation of impurity ions. Therefore, degradation such as carbonization of the resist pattern during ion implantation and stress due to ion introduction can be alleviated by the heat. Furthermore, because the solvent residing in the resist pattern can be removed, the degas amount at the time of ashing is reduced to prevent particles of the resist from peeling off.

According to the method of manufacturing a semiconductor device of the said still another aspect of the present invention, the surface of the semiconductor substrate is rinsed to remove adsorbed atoms or a natural oxide film on the surface of the semiconductor substrate prior to formation of a resist layer on the semiconductor substrate surface. Therefore, the nucleus which becomes the cause of the generated $N_2$ gas assembly due to decomposition of the photosensitive agent during exposure is removed. Therefore, damage of the resist film or spatter of particles of the resist film due to $N_2$ gas concentration can be prevented.

According to the method of manufacturing a semiconductor device of the said still further aspect of the present invention, the rinsing of the surface of the semiconductor substrate is carried out using a rinsing agent selected from the group consisting of alkaline mixture such as of $NH_4OH/H_2O_2/H_2O$, and acidic mixture such as of $HCl/H_2O_2/H_2O$, $H_2SO_4/H_2O_2/H_2O$, $HCl/HNO_3/H_2O$, $HF/H_2O$, $HF/H_2O_2/H_2O$. Therefore, adsorbed atoms or a natural oxide film on the surface of the semiconductor substrate can be removed effectively. As a result, the nucleus which becomes the cause of $N_2$ gas concentration is removed. Therefore, the resist pattern is not damaged during ashing.

According to the resist composition of the said yet further aspect of the present invention, a phenol resin having the above-described formula, and a photosensitive agent are included. Thus, a resist film is provided superior in heat resistance and adherence, and reduced in gas generation.

According to the resist composition of the said yet further aspect of the present invention, a solvent selected from the group consisting of a cellosolve type solvent, an ester type solvent, and a high polar liquid is used. This facilitates dissolution of the phenol resin and the photosensitive agent in the solvent to improve stability of the resist composition.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device for forming a buried impurity layer at a deep position of a semiconductor substrate, comprising the steps of:

(a) preparing positive type resist solution containing a phenol resin including at least 40 mole % of meta-cresol unit and having a weight-average molecular weight of at least 10000 in polystyrene conversion, and a photosensitive agent having a quinone diazide portion, wherein said quinone diazide portion is included by 0.40 mmol–0.55 mmol with respect to 1g of the whole resist solid, wherein said photosensitive agent having a quinone diazide portion has a structural unit represented by the following formula

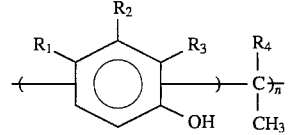

(wherein, in the formula, $R_1$, $R_2$, and $R_3$ represent OH, $CH_3$ or H and $R_4$ represents $CH_3$ or H), having a weight-average molecular weight of 500–2000 in polystyrene conversion, wherein said hydroxyl group in said formula is partially or completely esterified by 1,2-naphthoquinone diazide-4-sulfonic acid or 1,2-naphthoquinone diazide-5-sulfonic acid, (b) forming a resist film having a film thickness of at least 3 μm on said semiconductor substrate using said positive type resist solution, (c) selectively exposing said resist film to form an image, (d) baking said resist film at a temperature of 110° C.–130° C. after exposure and before developing, (e) developing and then rinsing said resist film to form a resist pattern, (f) baking said resist pattern at a temperature of 100° C.–130° C., (g) implanting impurity ions at high energy of 1 MeV or above to the main surface of said semiconductor substrate using said resist pattern as a mask to form a buried impurity layer at a deep position of said semiconductor substrate, and (h) removing said resist pattern.

2. The method according to claim 1, wherein said baking step carried out after exposure and before developing is carried out at 115° C.–125° C.

3. The method according to claim 1, wherein said baking of said resist pattern is carried out at 105° C.–115° C.

4. The method according to claim 1, wherein said phenol resin and said photosensitive agent are dissolved in a solvent selected from the group consisting of a cellosolve type solvent, an ester type solvent, and a high polar liquid.

5. A method of forming a buried impurity layer at a deep position of a semiconductor substrate, comprising the steps of:

(a) preparing a positive type resist solution containing a phenol resin including at least 40 mole % of midi-cresol unit and having a weight-average molecular weight of at least 10000 in polystyrene conversion, and a photosensitive agent having a quinone diazide portion, wherein said quinone diazide portion is included by 0.40 mmol–0.55 mmol with respect to 1g of the whole resist solid, wherein said photosensitive agent having a quinone diazide portion has a structural unit represented by the following formula

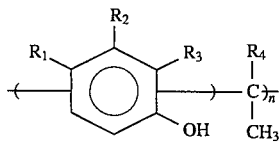

(wherein, in the formula, $R_1$, $R_2$, and $R_3$ represent OH, $CH_3$ or H and $R_4$ represents $CH_3$ or H), having a weight-average molecular weight of 500–2000 in polystyrene conversion, wherein said hydroxyl group in said formula is partially or completely esterified by 1,2-naphthoquinone diazide-4-sulfonic acid or 1,2-naphthoquinone diazide-5-sulfonic acid, (b) forming a resist film having a film thickness of at least 3 μm on said semiconductor substrate using said positive type resist solution, (c) patterning said resist film to a desired configuration to obtain a resist pattern, (d) implanting impurity ions at high energy of 1 MeV or above to the main surface of said semiconductor substrate using said resist pattern as a mask to form a buried impurity layer at a deep position of said semiconductor substrate, (e) heating said resist pattern at a temperature of at least 120° C. after said implantation of impurity ions, and (f) removing said resist pattern by ashing using a plasma including oxygen.

6. The method according to claim 5, wherein said heating of the resist pattern is carried out at least 130° C.

7. The method according to claim 6, wherein said heating of the resist pattern is carried out by at least 150° C.

8. The method according to claim 5, wherein said heating of the resist pattern is carried out by placing said semiconductor substrate on a hot plate for at least 3 minutes.

9. The method according to claim 8, wherein said heating is carried out for 5 minutes–7 minutes.

10. The method according to claim 5, wherein said heating of the resist pattern is carried out by introducing said semiconductor substrate in an oven to be processed for more than 30 minutes.

11. The method according to claim 10, wherein said heating is carried out for 60 minutes–90 minutes.

12. The method according to claim 5, wherein said heating of the resist pattern is carried out in a pressure of not more than $10^{-2}$ Torr.

13. The method according to claim 12, wherein said heating is carried out in a pressure of not more than $10^{-5}$ Torr.

14. A method of forming a buried impurity layer at a deep position of a semiconductor substrate, comprising the steps of: (a) preparing a positive type resist solution containing a phenol resin including at least 40 mole % of midi-cresol unit and having a weight-average molecular weight of at least 10000 in polystyrene conversion, and a photosensitive agent having a quinone diazide portion, wherein said quinone diazide portion is included by 0.40 mmol–0.55 mmol with respect to 1g of the whole resist solid, wherein said photosensitive agent having a quinone diazide portion has a structural unit represented by the following general formula

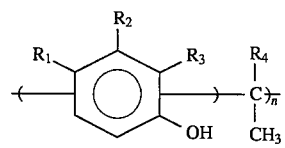

(wherein, in the formula $R_1$, $R_2$, and $R_3$ represent OH, $CH_3$ or H and $R_4$ represents $CH_3$ or H), having a weight-average molecular weight of 500–2000 in polystyrene conversion, wherein said hydroxyl group in said formula is partially or completely esterified by 1,2-naphthoquinone diazide-4-sulfonic acid or 1,2-naphthoquinone diazide-5-sulfonic acid, (b) preparing a semiconductor substrate, (c) rinsing in a rinsing agent the surface of said semiconductor substrate to remove adsorbed atoms or a natural oxide film on the surface of said semiconductor substrate, (d) forming a resist film having a film thickness of at least 3 μm on the surface of said semiconductor substrate using said positive type resist solution, (e) selectively exposing said resist film to form an image, (f) developing said resist film to form a resist pattern, (g) implanting impurity ions at high energy of 1 MeV or above to the surface of said semiconductor substrate using said resist pattern as a mask to form a buried impurity layer at a deep position of said semiconductor substrate, and (h) removing said resist pattern.

15. The method according to claim 14, wherein said rinsing of the surface of said semiconductor substrate is carried out using a rinsing agent selected from the group consisting of alkaline mixture of $NH_4OH/H_2O_2/H_2O$, and acidic mixture of $HCl/H_2O_2/H_2O$, $H_2SO_4/H_2O_2/H_2O$, $HCl/HNO_3/H_2O$, $HF/H_2O$, $HF/H_2O_2/H_2O$.

* * * * *